(12) United States Patent
Tanikawa et al.

(10) Patent No.: US 6,542,411 B2
(45) Date of Patent: Apr. 1, 2003

(54) NONVOLATILE MEMORY AND SEMICONDUCTOR DEVICE WITH CONTROLLED VOLTAGE BOOSTER CIRCUIT

(75) Inventors: Hiroyuki Tanikawa, Kodaira (JP); Toshihiro Tanaka, Akiruno (JP); Yutaka Shinagawa, Iruma (JP); Yoshiki Kawajiri, Masashino (JP); Masamichi Fujito, Kodaira (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/970,675

(22) Filed: Oct. 5, 2001

(65) Prior Publication Data
US 2002/0048193 A1 Apr. 25, 2002

(30) Foreign Application Priority Data
Oct. 23, 2000 (JP) ........................................ 2000-322782

(51) Int. Cl.$^7$ .............................................. G11C 16/04
(52) U.S. Cl. ............................... 365/185.33; 365/185.28
(58) Field of Search ....................... 365/185.33, 185.28, 365/185.29, 185.3, 189.09, 218, 226

(56) References Cited

U.S. PATENT DOCUMENTS

| | | | |
|---|---|---|---|
| 5,307,470 A | * | 4/1994 | Kataoka et al. .............. 395/425 |
| 5,444,664 A | * | 8/1995 | Kuroda et al. ............... 365/226 |
| 6,222,779 B1 | * | 4/2001 | Saito et al. ............ 365/189.09 |

FOREIGN PATENT DOCUMENTS

JP        07050097 A    *   2/1995           G11C/16/06

\* cited by examiner

*Primary Examiner*—Michael S. Lebentritt
*Assistant Examiner*—Anh Phung
(74) *Attorney, Agent, or Firm*—Miles & Stockbridge P.C.

(57) ABSTRACT

A nonvolatile memory includes a control register (CRG) for providing instructions as to basic operations such as writing, erasing, reading, etc., a boosted voltage attainment detecting circuit for detecting whether a voltage boosted by a booster circuit has reached a desired level, a circuit which counts the time required to apply each of write and erase voltages, and a circuit which detects the completion of the writing or erasing. Respective operations are automatically advanced by simple setting of the operation instructions to the control register. After the completion of the operations, an end flag (FLAG) provided within the control register is set to notify the completion of the writing or erasing.

22 Claims, 24 Drawing Sheets

NONVOLATILE MEMORY AND SEMICONDUCTOR DEVICE WITH CONTROLLED VOLTAGE BOOSTER CIRCUIT

BACKGROUND OF THE INVENTION

The present invention relates to a technology effective for application to a system for controlling writing and erasing effected on an electrically programmable erasable nonvolatile memory and a system for controlling a booster circuit. The present invention also relates to, for example, a technology effective for use in a flash memory capable of collectively erasing data in block units, and a microcomputer with the flash memory built therein.

A flash memory makes use of nonvolatile storage or memory elements comprising MOSFETs formed in a two-layer structure having control and floating gates. As a writing system employed in the flash memory, there have heretofore been known, a system using an FN tunnel phenomenon and a system using hot electrons. The system using the FN tunnel phenomenon is a system wherein a voltage is applied between a control gate and a substrate (or well region) or between the control gate and the source or drain to inject an electrical charge into the floating gate or discharge it therefrom by use of the FN tunnel phenomenon, thereby changing a threshold voltage. On the other hand, the system using the hot electrons is a system wherein a current is caused to flow between a source and a drain in a state in which a high voltage is applied to a control gate and hot electrons produced in a channel are injected into a floating gate, thereby changing a threshold voltage.

The FN tunnel-based writing system has an advantage in that since a write current is small, writing is allowed in word-line units like 128 bytes, for example, and hence batch writing can be performed. In the writing system using the hot electrons on the other hand, batch writing in word-line units is difficult because a write current increases, and hence the writing is carried out in units of one byte. Storage or memory elements at the adoption of the FN tunnel-based writing system are difficult in micro-fabrication from relationships with withstand voltages and are not improved in integration density or degree. Therefore, the hot electron-based writing system is advantageous over the FN tunnel-base writing system in terms of an increase in capacity.

Incidentally, even when either of the writing system is adopted, the erasing of data in the flash memory is often carried out in block units, i.e., simultaneously with respect to a plurality of sectors which share the use of a well region and a source line.

SUMMARY OF THE INVENTION

The present inventors have discussed in detail the technology of shortening the time required for writing in the flash memory which has adopted the hot electron-based writing system.

With a view toward performing control on writing and erasing of a flash memory in a microcomputer with the flash memory built-in (hereinafter called a "micon with a built-in flash"), a system has heretofore been adopted wherein a CPU sets write and erase bits of a control register lying within a flash control circuit and starts writing or erasing, and when the CPU manages time according to a program and a suitable time has elapsed, the CPU releases the write and erase bits to thereby complete write and erase operations. In the above-described micon with the built-in flash, which has adopted the FN tunnel-based writing system for performing writing simultaneously in the form of one sector (e.g., 128 bytes) corresponding to word-line units, for example, even the above-described control system whose time management is performed by the CPU, was effective because the time required to apply a write voltage was sufficiently longer than an operating period or cycle of the CPU. Even in the case of a so-called single flash memory built-in packaged with a controller for performing write control or the like on a flash memory, the controller has performed similar time management.

However, in the micon with the built-in flash, which has adopted the hot electron-based writing system, write pulses must be applied to drains of memory cells in the sector being in selection as described above in order bit by bit or in 8-bit units. In this case, the width of each write pulse becomes very short as compared with the FN-tunnel system. Therefore, the CPU is difficult to accurately control such a short time except when the operating frequency of the CPU is sufficiently high. When a margin therefor is sufficiently ensured, a write time required becomes long and a high voltage is applied even to each non-selected memory cell, whereby a phenomenon called "threshold voltage-varying disturb" is apt to occur. On the other hand, a problem arises in that when the margin for the write pulse width is reduced, a write failure occurs and hence the number of times that pulses are applied up to the completion of writing, increases, so that the total time required for the writing becomes long.

Further, a problem arises in that an overhead time attendant on communications between the CPU and each memory is also included in the time required.

In the system wherein the CPU or controller manages the write pulses even in the case of the single flash as well as the micon with the built-in flash, the CPU or the like determines an end time assuming the worst case in regard to the characteristic of each storage element and a source voltage. Therefore, a flash memory good in characteristic will often cause needless latency time.

Further, when it is desired to type diversification of products different in storage capacity of flash memories, products different in operating frequency thereof, products different in source voltage, etc. in the micon with the built-in flash and the single flash, a boosting time for a booster circuit for generating a write voltage used for the flash memory also changes with a change in product. Therefore, the system wherein the write pulses are managed by the CPU or the like as described above, was also accompanied by a problem that it needed to re-design the booster circuit for each type and take measures such as rightsizing for a CPU's program correction and controller's control, and the time required to develop a new product became long.

An object of the present invention is to provide a nonvolatile memory like a flash memory capable of shortening a total write time required, and a semiconductor device such as a microcomputer with the nonvolatile memory built therein.

Another object of the present invention is to make it possible to provide a nonvolatile memory like a flash memory capable of performing writing and erasing in a optimum time without taking measures such as the re-design of a booster circuit, rewriting or updating of a CPU's program, etc. even in the case where internal booster circuits are different in boosting time due to the difference between specifications of storage capacities or the like, and a semiconductor device such as a microcomputer with the nonvolatile memory built therein.

The above, other objects and novel features of the present invention will become apparent from the description of the present specification and the accompanying drawings.

Summaries of typical ones of the inventions disclosed in the present application will be explained in brief as follows:

A nonvolatile memory like a flash memory having adopted a hot electron-based writing system, or a semiconductor device with the nonvolatile memory built therein is provided with a memory array having a plurality of nonvolatile memory elements which store data according to magnitudes of threshold voltages thereof, a booster circuit which generates a voltage applied to each of the nonvolatile memory elements upon writing or erasing of the data, a boosted voltage detecting circuit which detects the level of the voltage boosted by the booster circuit, a write/erase control circuit which starts the writing or erasing based on the detection of the voltage by the boosted voltage detecting circuit, a write/erase end detecting circuit which detects the completion of the writing or erasing started by the write/erase control circuit, and an end flag indicative of the completion of the writing or erasing started by the write/erase control circuit.

According to the above means, the writing or erasing is automatically advanced internally from the boosting and the completion thereof is notified by the flag upon its completion. Therefore, it is not necessary to control write or erase pulses or the like from outside. Even when internal booster circuits are different in boosting time due to the difference in specifications such as storage capacity, the writing or erasing can be carried out in an optimum time without re-designing the booster circuit and taking measures such as rightsizing for a CPU's program correction or controller's control, etc.

Preferably, a control register having control bits each indicative of an entry into an operation for the writing or erasing is provided. The booster circuit starts boosting according to each of the control bits set thereto. Thus, an operation corresponding to the set control bit is automatically started.

Further, there are provided a plurality of booster circuits which generate a plurality of voltages respectively applied to the nonvolatile memory elements upon writing or erasing of data, and a plurality of boosted voltage detecting circuits which respectively detect the levels of the voltages boosted by the plurality of booster circuits. The write/erase control circuit starts writing or erasing based on the result that the plurality of boosted voltage detecting circuits have detected that all the boosted voltages respectively have attained a predetermined level. Consequently, the following operation can be started in the shortest time without causing needless time after the completion of boosting.

Here, the write/erase end detecting circuit comprises, for example, a delay circuit which delays a signal detected by the boosted voltage detecting circuit, or a counter circuit or the like which counts a clock signal, based on the detected signal. Thus, the write/erase end detecting circuit can easily be implemented through the use of the known technology.

There is also provided a discharge circuit which discharges the voltage boosted by the booster circuit. The discharge circuit starts discharging based on a signal detected by the write/erase end detecting circuit. Thus, it is possible to start the discharge of the voltage of the booster circuit without causing needless time after the completion of the writing or erasing.

There is further provided a discharge end detecting circuit which detects that the output voltage of the booster circuit, which has been discharged by the discharge circuit, has reached a predetermined level. The end flag is set based on a signal detected by the discharge end detecting circuit. Thus, it is possible to immediately notify the perfect completion of the operation attendant to the writing or erasing to the outside.

There are still further provided a data register which holds write data therein, and a write control circuit which applies a write voltage to each of bit lines according to the write data held in the data register. When bits for the write data held in the data register are of a logic "1" (or logic "0"), the write control circuit skips the bits and sequentially applies the write voltage in association with each of bits indicative of the logic "0" (or logic "1"). The nonvolatile memory like the flash memory having adopted the hot electron-based writing system can shorten a total write time required.

Further, the time required to apply the write voltage is determined based on a clock signal and changed according to a change in the cycle of the clock signal. Thus, the change in the time required to apply the write voltage according to the characteristic or the like of each storage element makes it possible to complete the optimum writing in a short period of time. Further, the change in the time required to apply the write voltage can be realized by a simple method of changing the cycle of the clock signal.

There is still further provided a shift register which sequentially outputs the write voltage, based on the clock signal and the write data held in the data register. The write/erase end detecting circuit detects that a pulse has reached a final stage of the shift register, thereby judging the writing to be completed. It is thus possible to sequentially apply the write voltage to each of the plural storage elements. A peak current can be controlled or suppressed as compared with the system of simultaneously applying the write voltage. It is also possible to detect the completion of the writing with extreme ease.

There are still further provided a level shifter which supplies the boosted voltage generated by the booster circuit to each of the nonvolatile memory elements upon writing or erasing, and a level determining circuit which determines the level of the boosted voltage generated by the booster circuit. When the level determining circuit has determined that the boosted voltage has exceeded a predetermined level, the level determining circuit serves so as to select a source voltage applied to the level shifter. It is thus possible to avoid the application of a voltage greater than a withstand voltage to each element constituting the level shifter and relax or lighten up withstand conditions.

There is still further provided a second level determining circuit which determines the level of the boosted voltage generated by the booster circuit. The booster circuit comprises a charge pump including MOSFETs constituting the charge pump, which are formed in a plurality of well regions formed on the surface of a semiconductor substrate in the form of being divided into the high-voltage side and the low-voltage side. Further, the booster circuit is configured so as to select a bias voltage applied to the well region on the high-voltage side when the second level determining circuit determines that the boosted voltage has reached a predetermined level. Thus, it is possible to avoid a reduction in the efficiency of boosting due to an increase in threshold voltage of each MOSFET constituting the charge pump by a substrate effect.

There are still further provided a command register which holds a command code supplied from outside, and a sequence control circuit which performs write or erase control according to the command code set to the command register. The sequence control circuit sets the respective control bits of the control register in response to a predetermined signal outputted from an internal circuit and starts the operations of other internal circuits to which the control bits are set. Thus, a series of operations such as the writing and its verify, and the erasing and its verify, etc. can be advanced without receiving instructions issued from outside. Further, the sequence control circuit can be simplified in configuration and made easy in design.

A second invention of the present application is one wherein a nonvolatile memory having a plurality of nonvolatile memory elements which store data according to the magnitudes of threshold voltages thereof, a booster circuit which generates a voltage applied to each of the nonvolatile memory elements upon writing or erasing of the data, a boosted voltage detecting circuit which detects the level of the voltage boosted by the booster circuit, a write/erase control circuit which starts the writing or erasing based on the detection of the voltage by the boosted voltage detecting circuit, a write/erase end detecting circuit which detects the completion of the writing or erasing started by the write/erase control circuit, an end flag indicative of the completion of the writing or erasing started by the write/erase control circuit, a control register having control bits each indicative of an entry into an operation for the writing or erasing, and a control circuit for giving instructions as to any of the writing, erasing and reading to the nonvolatile memory according to the setting of the control bits of the control register are formed on one semiconductor chip as a semiconductor device.

According to the above means, the writing or erasing is automatically advanced internally from the boosting and the completion thereof is notified by the flag upon its completion. Therefore, it is not necessary to control write pulses or the like from outside. Even when internal booster circuits are different in boosting time due to the difference in specifications such as storage capacity, the writing or erasing can be carried out in an optimum time without taking measures such as re-designing the booster circuit, the rewriting of each program of the control circuit, etc. There is also provided a control register having control bits each indicative of an entry into an operation for the writing or erasing. Therefore, the simple setting of a predetermined control bit of the control register by the control circuit allows the automatic start of an operation corresponding to the control bit, thereby making it possible to easily execute a desired operation.

Further, preferably, the control circuit reads the end flag to thereby detect that the operation for the nonvolatile memory has been completed, and sets the corresponding control bit of the control register to thereby provide the following instructions. Thus, the control circuit needs not manage a write time, an erase time, etc., and the load on the control circuit can be lightened.

DETAILED DESCRIPTION OF THE PREFERRED EMBODIMENTS

Figure 1:
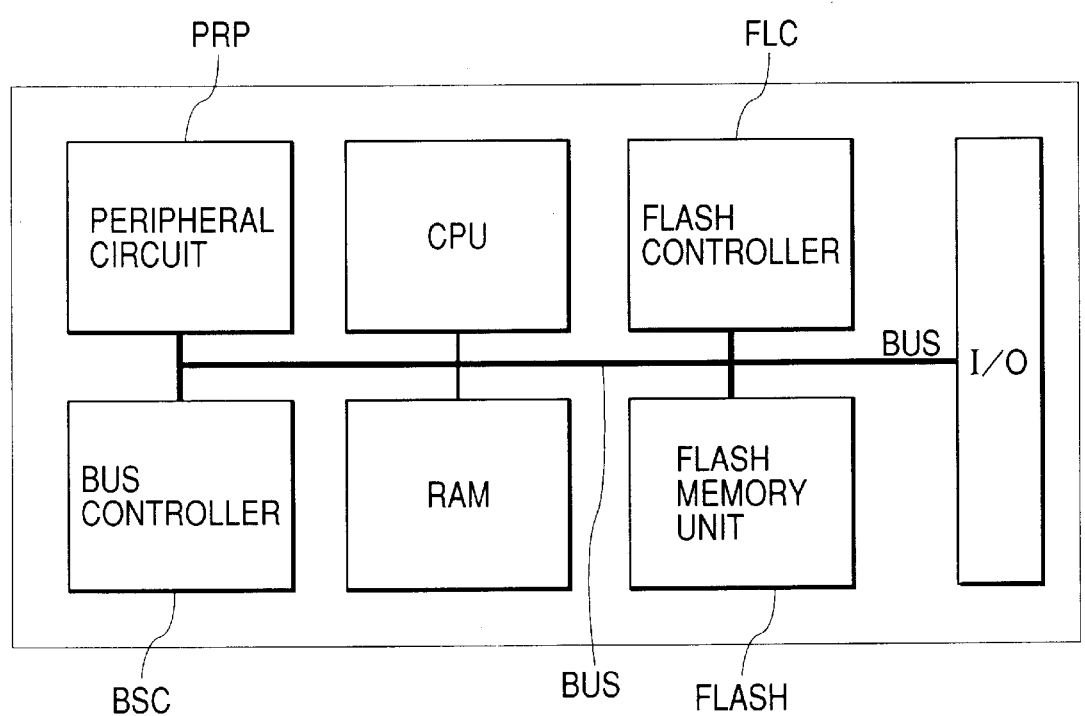
FIG. 1 is an overall block diagram showing the outline of one embodiment of a flash built-in micon to which the present invention is applied.

Preferred embodiments of the present invention will hereinafter be described with reference to the accompanying drawings. FIG. 1 shows a schematic configuration of a flash built-in micon to which the present invention is applied. Although not restricted in particular, respective circuit blocks shown in FIG. 1 are formed on a single semiconductor chip like monocrystal silicon.

In FIG. 1, designated at symbol FLASH is a flash memory unit provided with a memory array comprising nonvolatile elements. Designated at FLC is a flash mode controller for providing instructions such as writing, erasing, etc. for the flash memory unit, designated at CPU is a central processing unit for exerting control over the entire chip, designated at RAM is a random access memory for temporarily storing data and providing working areas for the central processing unit CPU, designated at PRP is a peripheral circuit such as various timer circuits, an A/D converter, a watch dog timer for system supervision, or the like, designated at BUS is an internal bus for connecting between the central processing unit CPU and the flash memory unit FLASH, the flash mode controller FLC and the RAM, designated at I/O is an interface circuit including an input/output port such as a serial communication port or the like for performing serial communications between an input/output buffer for outputting signals placed on the internal bus BUS to an external bus and taking in or capturing signals placed on the external bus and an external device, and designated at BSC is a bus controller for performing control or the like on an exclusive right to the internal bus BUS, respectively.

Although not shown in FIG. 1, the microcomputer may include an interrupt control circuit for determining the occurrence of an interrupt request to the CPU and its priority to thereby interrupt the CPU, a DMA transfer control circuit for controlling DMA (Direct Memory Access) transfer between the RAM and the flash memory unit FLASH or the like, an oscillator for generating clock signals necessary for the operation of a system, etc.

Figure 2:
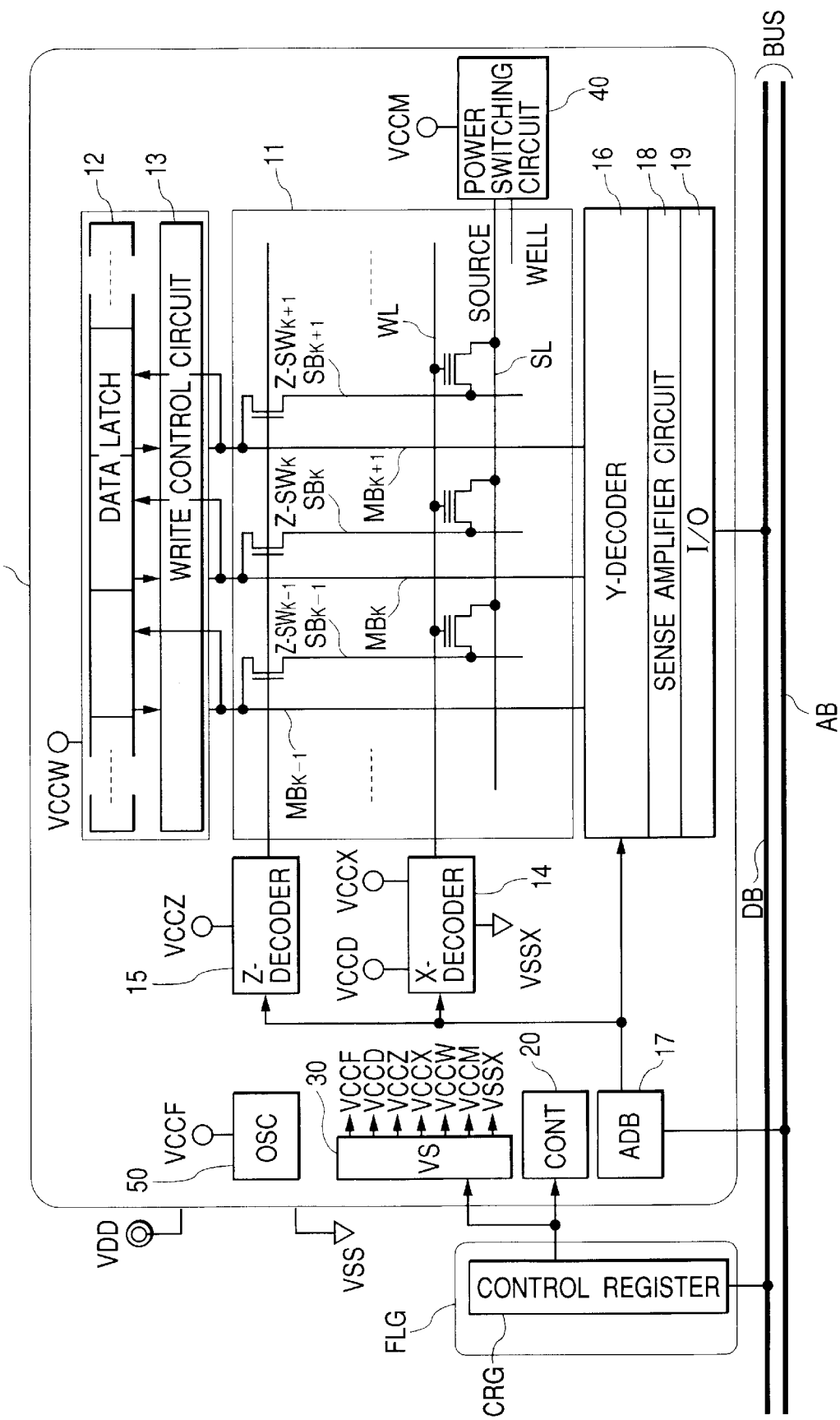
FIG. 2 is a block diagram illustrating an example of a configuration of a flash memory unit to which the present invention is applied.

FIG. 2 shows a schematic configuration of the flash memory unit FLASH. In FIG. 2, reference numeral 11 indicates a memory array wherein memory cells used as nonvolatile memory or storage elements comprising MOSFETs each having a control gate and a floating gate are arranged in matrix form, and reference numeral 12 indicates a write latch control circuit for writing externally-inputted write data in the memory array 11 based on the write data. The write latch control circuit 12 comprises a data register 12A for holding or retaining data having the number of bits corresponding to the number of memory cells connected to one word line, like 128 bytes, for example, and a write control circuit 13 for applying a write pulse to its corresponding bit line lying in the memory array 11, based on the data held in the data register 12A. Incidentally, the data register 12A may not retain the number of bits corresponding to the number of memory cells extending in a word line direction, i.e., the number of bit lines lying within the memory array 11 but may set the number of bits as the number of bits of an integral fraction thereof. Further, the data register 12A may be configured so as to be capable of supplying the number of bits equivalent to the integral fraction thereof to any of the corresponding plural bit lines through a selector (multiplexer) or the like.

Further, the memory array 11 employed in the present embodiment is hierarchically configured in a column direction. Memory cells in respective columns respectively have drains connected to common sub bit lines SB in units of 16, for example. The sub bit lines SB are respectively connected to main bit lines MB through selection switches MOSFET Z-SW. For example, sixteen memory cells connected to the same sub bit line and memory cells which share the use of word lines together with these sixteen memory cells, respectively have sources connected to a common source line SL. These memory cells whose sources are in common, are formed on the same well region formed on the surface of a semiconductor substrate and are set as a batch erasure unit. This will hereinafter be referred to as a "block".

On the other hand, control gates of memory cells MCs arranged in a horizontal direction, i.e., row direction are respectively connected to common word lines WL in row units. For example, 128×8 memory cells commonly connected to one word line constitute one sector and are set as a write unit. Incidentally, symbols or subscripts k−1, k, and k+1 affixed to SB, MB, etc. in FIG. 2 are respectively signs for making distinctions between respective bits and assume or take positive integers like 0 to 1023. In the present specification, when they are described simply as "bit lines", they means main bit lines MB. Incidentally, a memory connecting method is not limited to the above in the present invention.

Reference numeral 14 indicates an X-decoder for decoding an X-system address signal brought from an address bus AB to thereby select one word line WL corresponding to an X-system address from word lines lying within the memory array 11, reference numeral 15 indicates a Z-decoder for decoding a Z-system address signal for selecting a corresponding block to thereby on-off control a corresponding selection switch MOSFET Z-SW for connecting the sub bit line SB and its corresponding main bit line MB, reference numeral 16 indicates a Y-decoder for decoding a Y-system address signal captured from the address bus to thereby select data corresponding to one byte (or one word) lying within one sector, reference numeral 17 indicates an address buffer ADB for taking in or capturing each of address signals supplied from the CPU through the address bus, and reference numeral 18 indicates a sense amplifier circuit for amplifying a data signal read into the corresponding main bit line MB of the memory cell array 11 and outputting it therefrom, respectively.

Further, in addition to the above-described respective circuits, the flash memory unit employed in the present embodiment is provided with an I/O buffer circuit 19 lying between the sense amplifier 18 and a data bus DB so as to perform the input/output of a data signal, a control circuit 20 for generating control signals supplied to the respective circuits lying within the flash memory unit, based on control signals inputted from outside, a power circuit (VS) 30 for generating voltages necessary inside the chip, such as a write voltage, an erase voltage, a read voltage, a verify voltage, etc., based on a source voltage Vcc supplied from outside, selecting desired voltages from these voltages according to the state of operation of each memory, and supplying the selected desired voltages to the write control circuit 13, the X-decoder 14, etc., a well/source power switching circuit 40 for performing switching between voltages applied to the source line and a well region WELL as in the case where, for example, upon erasing, the common source line SL is rendered open and a boosted voltage is applied to the well region WELL, whereas upon writing and reading, a ground potential is applied to the source line and the well region, an oscillator 50 for generating clock signals necessary for a boosting operation and the like, etc.

On the other hand, the flash mode controller FLC comprises circuits added with some circuits around a control register CRG with the control register CRG as a principal one. When the CPU operates according to programs stored in the flash memory unit and the RAM to effect writing on the control register CRG, the flash mode controller FLC sends a start signal to each of the control circuit 20 and the power circuit 30 provided within the flash memory unit FLASH according to the state of each bit in the control register CRG to thereby allow them to perform writing, erasing, reading and verify operations, etc.

In addition to the control register CRG for the writing and erasing control, the flash mode controller FLC may be provided with a register for setting each value for voltage trimming and a register for holding or retaining relief information for replacing a memory sequence including defect bits in the memory array with a spare memory sequence. Incidentally, although not restricted in particular, the values stored in the trimming register are stored in their corresponding predetermined areas lying within the memory array 11 of the flash memory unit FLASH and read from the flash memory unit upon resetting, after which they can be set to the trimming register.

FIG. 3 shows examples of voltages applied to word lines WL, bit lines MB, common source lines SL and wells WELL upon erasing, post-erasing and writing. Now, the post erasing indicates a weak or low write operation for transitioning a threshold voltage of a memory cell whose threshold voltage is excessively lowered according to such erasing as indicated by hatching D in FIG. 4, in a direction to increase it. FIG. 4 shows a distribution of threshold voltages of a post-writing and post-erasing memory cell. In the flash memory unit employed in the present embodiment, although not restricted in particular, data "0" corresponds to a state in which the threshold voltage of each memory cell is high, whereas data "1" corresponds to a state in which the threshold voltage of each memory cell is low.

Figure 3A:
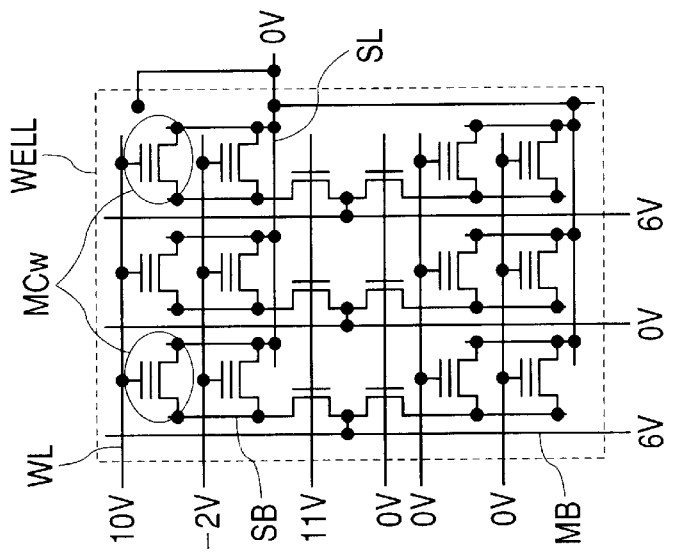
FIGS. 3A, 3B and 3C are circuits explanatory diagram depicting specific configuration examples illustrative of a memory array in a flash memory circuit and examples of bias voltages at the time of erasing and writing.
Figure 4:
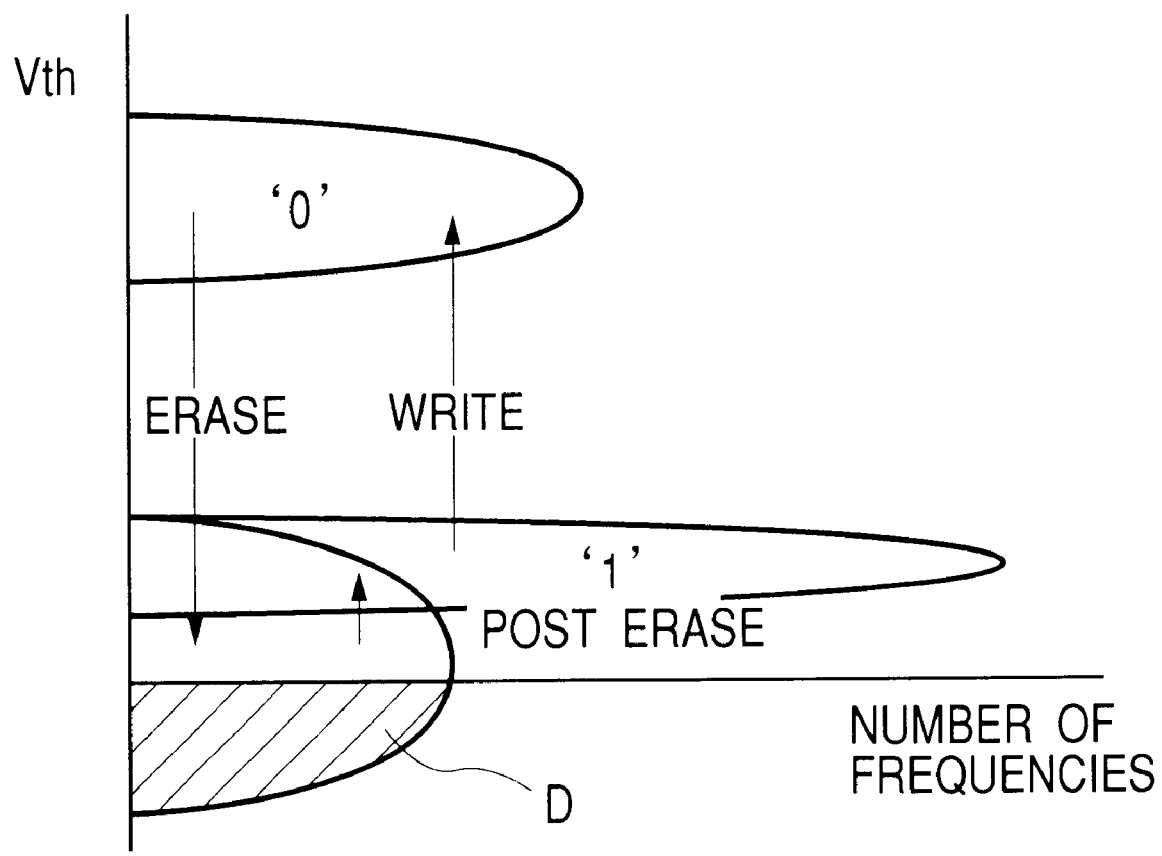
FIG. 4 is an explanatory diagram showing one example illustrative of a distribution of threshold voltages of a post-writing and post-erasure memory cell in the flash memory.

In the present embodiment, when the threshold voltage of each memory cell is changed from a high state to a low state upon the erasing operation, such voltages as shown in FIG. 3(A) are collectively applied to their corresponding memory cells of the entire block which shares the use of the well to thereby extract electrical charges from their corresponding floating gates. Therefore, the memory cell whose threshold voltage is originally low, might be excessively reduced in threshold voltage. When the threshold voltage of each memory cell is reduced to 0V or less, a drain current will flow in the corresponding memory cell even if the corresponding word line is in a state of being brought into a non-selection level (0V), so that the operation of accurately reading data from the selected memory cell that shares the use of the sub bit line SB, cannot be carried out. Thus, in the present embodiment, the post-erasing operation for increasing, only slightly, the threshold voltage of each memory cell whose threshold voltage is excessively lowered as indicated by the hatching D in FIG. 4, is also carried out.

Upon erasing, the bit lines MB and the common source line SL lying within the selected blocks (vertically symmetrical two blocks are selected in FIG. 3) are rendered open, i.e., they are respectively brought into a potentially floating state as shown in FIG. 3(A). A voltage of −11V is applied to the word lines WL and a voltage of 10V is applied to the well. Thus, a negative charge (electrons) is extracted or pulled out from the floating gate of each memory cell, so that the threshold voltage thereof is lowered.

Figure 3B:
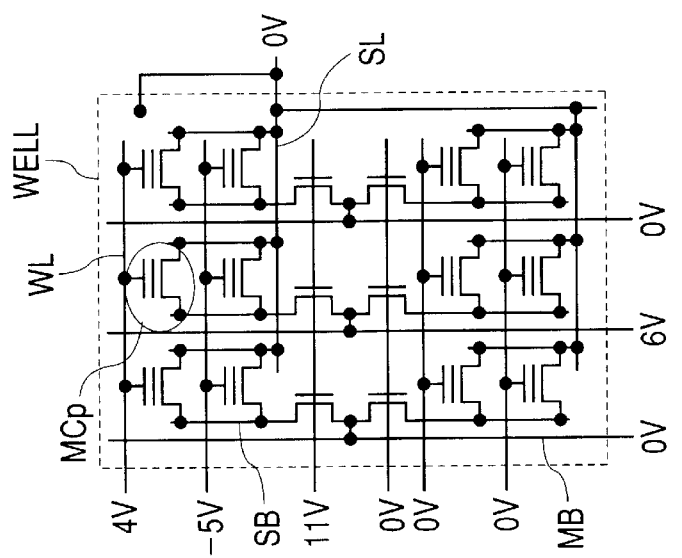
Figure 3C:
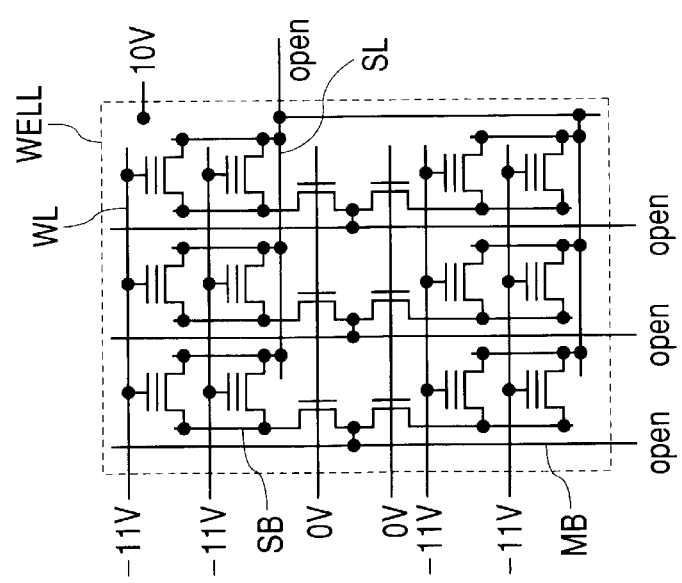

Upon writing, as shown in FIG. 3(C), 10V is applied to a word line WL or control gate of each selected memory cell, 6V is applied to each bit line or drain, and a ground potential is applied to a common source line SL and a well, respectively, so that a drain current flows in the selected memory cell. Thus hot electrons generated here are injected into the corresponding floating gate of each memory cell to increase its threshold voltage. At this time, a high voltage of 11V is applied to the gate of a selection MOSFET Z-SW between a sub bit line SB and a main bit line MB to which the selected memory cell is connected, so that it is turned on. Thus, the potential on the main bit line MB is transferred to its corresponding sub bit line SB. Further, a voltage of −2V is applied to a word line WL of each non-selected memory cell which keeps the selected memory cell and the sub bit line SB in common, so that miswriting produced due to disturbing is prohibited. In FIG. 3(C), cells marked with symbols MCw, are memory cells intended for writing.

Upon post-erasing, as shown in FIG. 3(B), 4V is applied to a word line WL or control gate of each selected memory cell, 6V is applied to a bit line or drain, and a ground potential is applied to a common source line SL and a well, respectively. In FIG. 3(B), a cell marked with a symbol MCp is a memory cell intended for the post-erasing. Incidentally, needless to say, the respective voltages are not limited to them and may be changed together with to the number of times. A pulse width (or "applying voltage time") may be changed according to the number of times. Upon the injection of the hot electrons for the writing and the post-erasing, an applying system wherein a back bias is taken for each memory cell, may be adopted.

As is apparent from comparison with FIG. 3(C), a bias relationship at the post-erasing in FIG. 3(B) is identical to the writing. The post-erasing is lower than the writing in the magnitude of each voltage. Owing to the setting of each selected memory cell to the weak written state in this way, the hot electrons are injected into its floating gate to thereby increase the threshold voltage thereof slightly. At this time, the high voltage of 11V is applied to the gate of each selection MOSFET Z-SW between the sub bit line SB and the main bit line MB to which the selected memory cell is connected, so that it is turned on. Thus, the potential on the main bit line MB is transferred to its corresponding sub bit line SB. Further, a voltage of −5V is applied to the word line WL of each non-selected memory cell which keeps the selected memory cell and the sub bit line SB in common, so that miswriting produced due to disturbing is prohibited.

Incidentally, all the bit lines MB are precharged to a potential Vpc like 1.0V upon data reading. Thereafter, one word line WL corresponding to a supplied address is selected and a voltage like 3.3V, for example is applied thereto. A ground potential (0V) is applied to the source of each memory cell through the common source line SL. Thus, when a current flows in each memory cell connected to the selected word line WL according to the threshold voltage thereof when it is low, so that the potential on the corresponding bit line MB is lowered. On the other hand, since no current flows therein when the threshold voltage is high, the potential on the bit line MB is maintained at a precharge level. This potential is amplified and detected by the sense amplifier 18.

Figure 5:
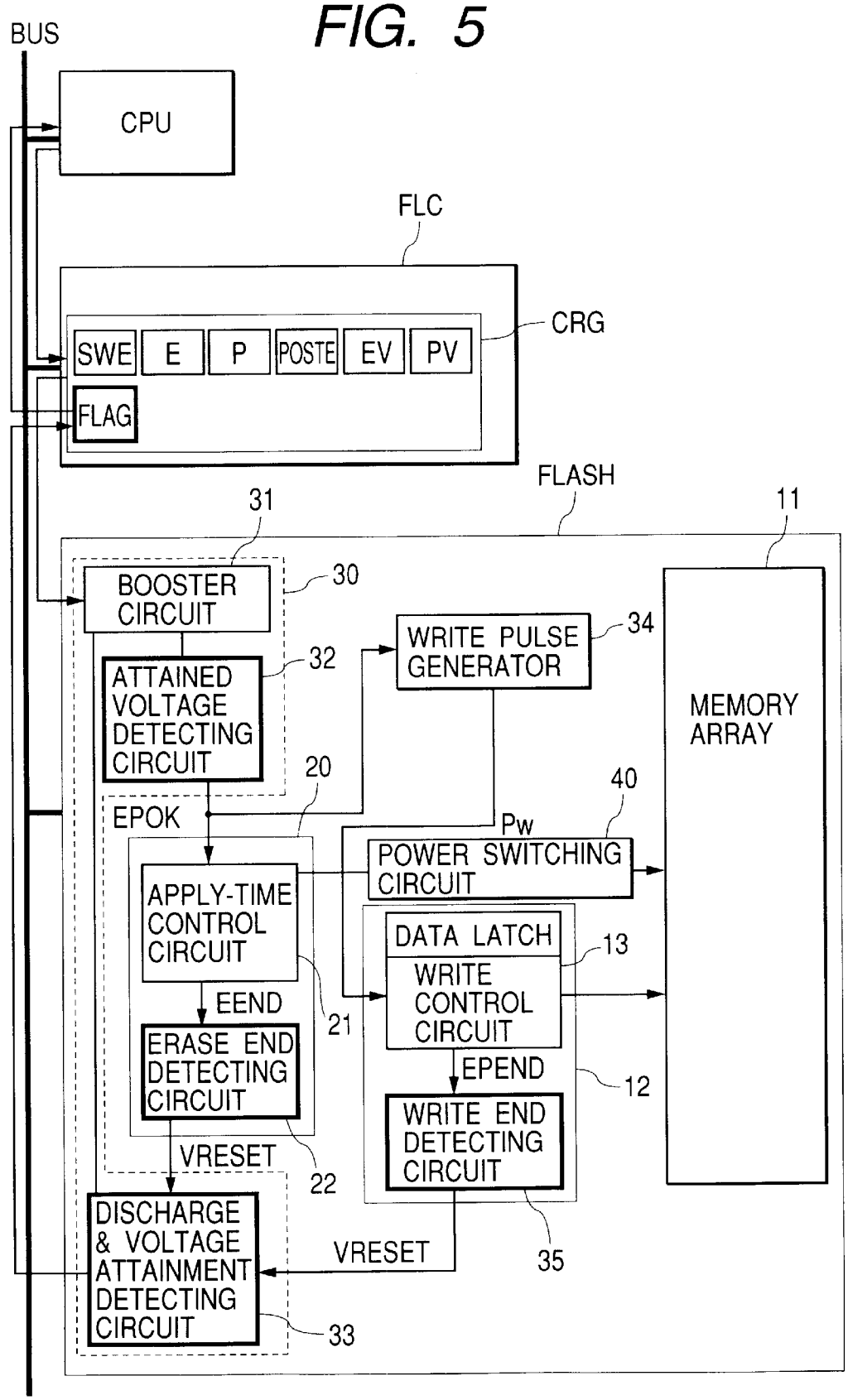
FIG. 5 is a block diagram showing one embodiment of a control register of a flash mode controller employed in the flash built-in micon to which the present invention is applied, and the outline of a writing/erasing circuit of the flash memory unit.

FIG. 5 shows a configuration example of the control register CRG lying within the flash mode controller FLC and a more specific configuration example of the flash memory unit FLASH employed in the embodiment shown in FIG. 2.

As shown in FIG. 5, the control register CRG provided within the flash mode controller FLC includes a rewrite enable bit SWE for providing instructions as to entry into a rewrite mode, an erase period bit E for giving instructions as to an erase period, a write period bit P for providing instructions as to a write period, a post erase period bit POSTE for providing instructions as to the start of post-erasing, an erase verify period bit EV for providing instructions as to an erase verify period, a write verify period bit PV for providing instructions as to a write verify period, and a write/erase end flag FLAG.

The respective bits of the control register CRG are configured so as to be capable of being set and reset by the CPU through the bus BUS. On the other hand, the end flag FLAG is configured so as to be capable of being set by a signal sent from the flash memory unit FLASH and reset from the CPU through the bus BUS. Described specifically, an input gate is opened according to a bus input control signal supplied from the CPU to the control register CRG to allow the respective bits to take in or capture signals on the bus BUS, whereby they can be set and reset. A circuit configuration and set and reset operations for the end flag FLAG will be explained in detail later.

In the flash memory unit FLASH employed in the present embodiment, when it is desired to rewrite data, the memory cell is temporarily subjected to an erase operation and then a write operation, followed by verify reading. Therefore, the entry into the rewrite mode is declared according to the rewrite enable bit SWE to allow the circuits lying within the flash memory unit FLASH to proceed to a write/erase ready state, whereby instructions as to the start of erase, write and verify operations are issued. It is thus possible to smoothly carry out the transition to the following operation.

The power circuit 30 of the flash memory unit FLASH comprises a booster circuit 31 such as a charge pump or the like, an attained voltage detecting circuit 32 for detecting whether a voltage boosted by the booster circuit 31 has attained a target or intended voltage, and a discharge & voltage attainment detecting circuit 33 for detecting whether the voltage is reduced to a predetermined voltage or less after the completion of the above boosting. The booster circuit 31 is configured so as to automatically start boosting when the write period bit P or erase period bit E of the control register CRG is set.

The control circuit 20 comprises an apply-time control circuit 21 which comprises a delay circuit for delaying a signal detected by the attained voltage detecting circuit 32 or a counter circuit for counting a clock signal, based on the detected signal and which controls a voltage apply time, and an erase end detecting circuit 22 for detecting an erase end, based on a signal sent from the apply-time control circuit 21. The discharge & voltage attainment detecting circuit 33 starts the discharge of the booster circuit 31 according to a signal VRESET detected by the erase end detecting circuit 22, detects whether the discharge thereof is completed, and sets the write/erase end flag FLAG for the control register CRG lying within the flash mode controller FLC.

There is also provided a write pulse generator 34 for generating a write pulse in response to the detected signal of the attained voltage detecting circuit 32 and supplying it to the write control circuit 13. The write latch control circuit 12 is provided with a write end detecting circuit 35 for detecting the end of writing by the write control circuit 13. The write end detecting circuit 35 is configured so as to detect that the write pulse has attained the final bit line in the write control circuit 13 as will be described later, for example, thereby detecting the end of writing with respect to one sector corresponding to the word line unit, i.e., 128 bytes.

The discharge & voltage attainment detecting circuit 33 starts the discharge of the booster circuit 31 according to a signal VRESET detected by the write end detecting circuit 35 and detects whether the discharge thereof is ended. When the discharge & voltage attainment detecting circuit 33 detects the end of its discharge, it sets the write/erase end flag FLAG of the control register CRG lying within the flash mode controller FLC and notifies the completion of writing or erasing to the CPU.

In the present embodiment as described above, the CPU may simply set or reset the respective bits of the control register CRG and needs not manage time attendant to the write or erase operation. The control circuit 20 and the like provided within the flash memory unit FLASH automatically perform all the controls on the operations such as control on the booster circuit 31 at the writing or erasing, the start of application of the boosted voltage, the completion of its application, and the discharge of the booster circuit, etc. When the writing or erasing is completed, the discharge & voltage attainment detecting circuit 33 of the flash memory unit sets the write/erase flag FLAG as described above. Therefore, the CPU is capable of always recognizing by going into the reading of the flag whether the writing or erasing has been finished.

Incidentally, although not shown in FIG. 5, there are provided a register for setting the level of a boosted voltage, a register for controlling a pulse width, and an arithmetic control circuit for generating control signals used for the booster circuit 31 and the write pulse generator 34, based on values set to these registers to thereby control or adjust the level of a generated boosted voltage and the width of a write pulse. An embodiment provided with these registers and the operation thereof will be described in detail later.

Figure 6:
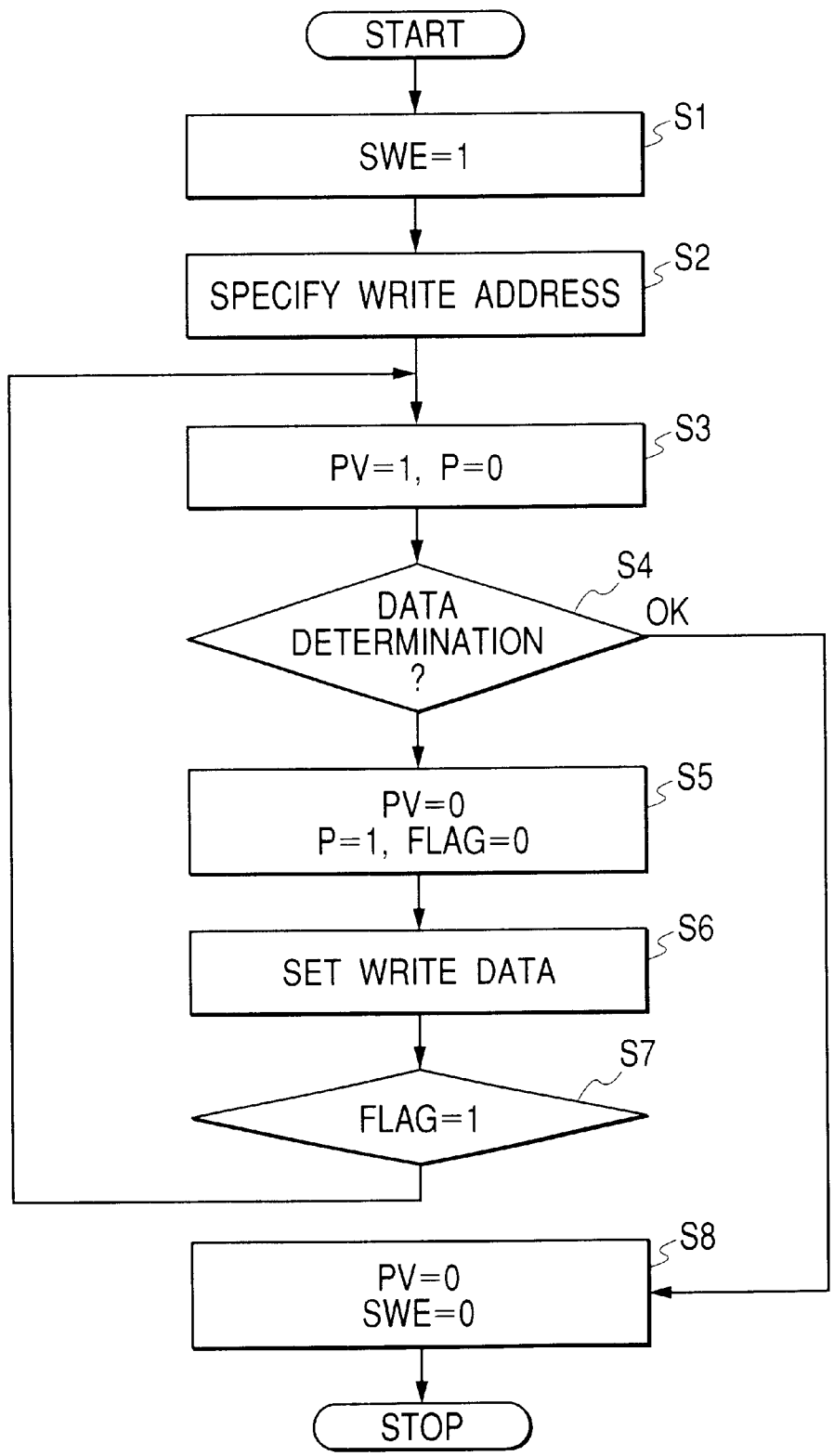
FIG. 6 is a flowchart illustrating one example of a write procedure employed in the flash built-in micon according to the present invention.

A write procedure of the flash memory unit employed in the embodiment will next be explained with reference to FIG. 6.

When a write operation is started, the CPU first sets the rewrite enable bit SWE of the control register CRG to "1" (Step S1). Next, a write verify address is supplied from the CPU to the flash memory unit through the address bus, which in turn is taken in the address buffer 17 to thereby designate or specify a verify address (Step S2). Then the CPU sets the write verify period bit PV of the control register CRG to "1" and resets the write period bit P to "0" (Step S3). Thus, the flash memory unit reads data corresponding to the verify address specified in Step S2 from the corresponding memory array.

The CPU compares the read data with write data to thereby determine whether the writing has been finished (Step S4). The reason why the verify is first carried out in this way, is that when the writing is done all at once without the execution of the verify, the threshold voltage of each memory cell placed in an already written state changes. When the writing is found to be uncompleted upon the data determination in Step S4, the write verify period PV is reset to "0", the write period bit P is set to "1" as an alternative, and the write/erase end flag FLAG is reset to "0" in the next Step S5. Further, write data corresponding to one word line for writing is supplied from the CPU to the flash memory unit through the data bus and set to the data register 12A (Step S6).

Thus, the writing is started in the flash memory unit when the booster circuit 31 starts boosting and the attained voltage detecting circuit 32 has detected that the boosted voltage has attained a target voltage. When the write end detecting circuit 35 detects the end of writing, the discharge & voltage attainment detecting circuit 33 starts the discharge of the booster circuit 31. When the completion of the discharge of the booster circuit 31 is detected, the write/erase end flag FLAG is set.

The CPU checks for the setting of the write/erase end flag FLAG when some time has elapsed after the setting of the write data in Step S6 (Step S7). If the write/erase end flag FLAG is found not to have been set, then the CPU is held in standby as it is. When the write/erase end flag FLAG is found to have been set, the CPU returns to Step S3, where it sets the write verify period bit PV of the control register CRG to "1" and resets the write period bit P to "0", thereby performing verify reading.

When the CPU determines read data and judges the writing to be completed in Step S4, it proceeds to Step S8, where the write verify period bit PV and rewrite enable bit SWE of the control register CRG are reset to "0", whereby a series of writing processes are completed.

Figure 7:
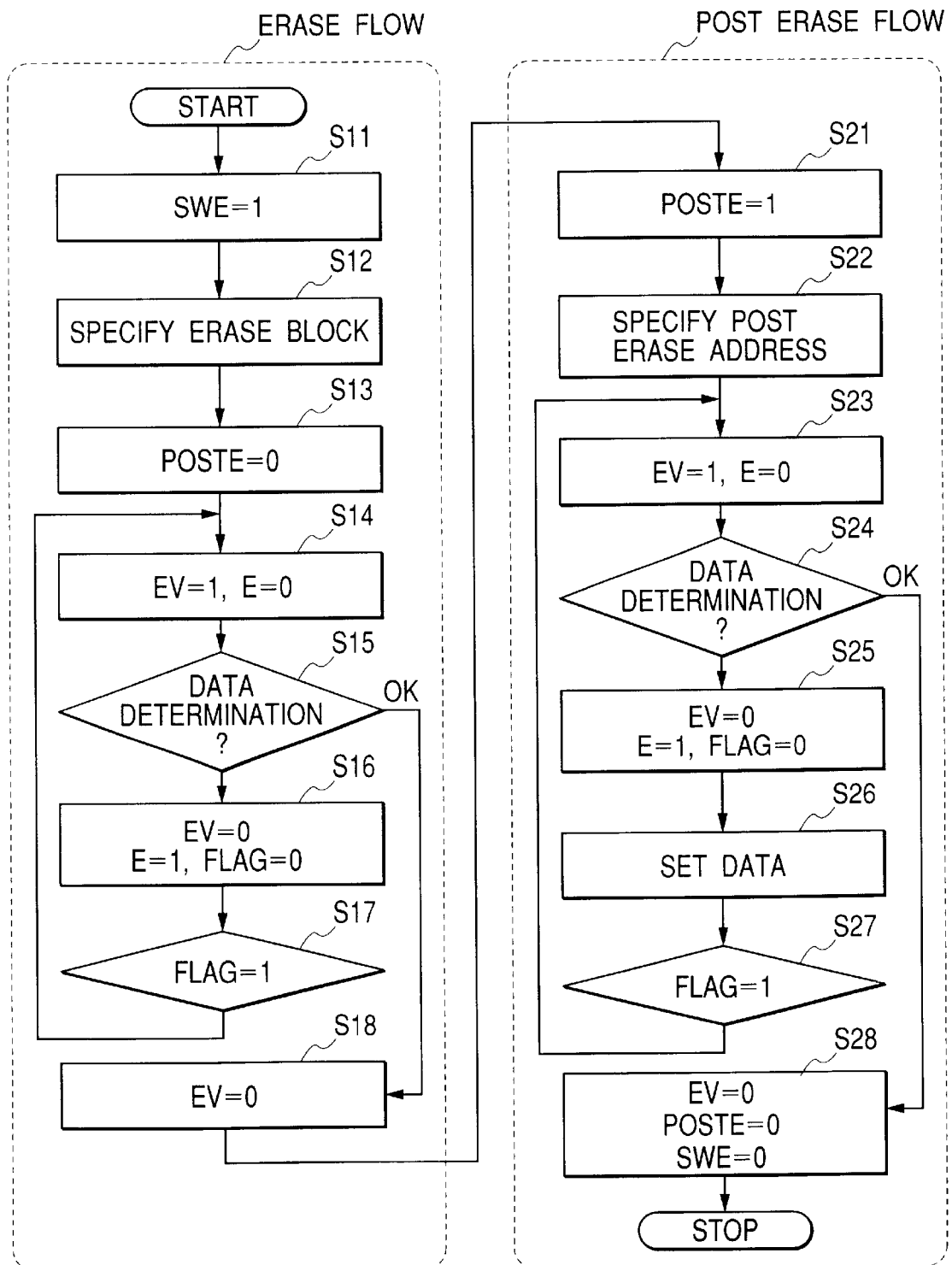
FIG. 7 is a flowchart showing one example of an erase procedure employed in the flash built-in micon according to the present invention.

A procedure for the erase operation executed in the flash memory unit employed in the embodiment will next be explained with reference to FIG. 7.

When the erase operation is started, the CPU first sets the rewrite enable bit SWE of the control register CRG to "1" (Step S11). Next, the CPU supplies an address (Z address) for specifying an erase-intended block to the flash memory unit through the address bus. The address is taken in the address buffer 17 to thereby designate or specify the corresponding erase block (Step S12). Then the CPU resets the post erase period bit POSTE of the control register CRG to "0" (Step S13), sets the erase verify period bit EV to "1" and resets the erase period bit E to "0" (Step S14). Thus, the flash memory unit reads data corresponding to the block specified in Step S12 from the corresponding memory array.

The CPU determines whether the read data are all "1", i.e., the erasing has been completed (Step S15). The reason why the verify is first carried out in this way, is that when the erasing is done all at once without the execution of the verify, the threshold voltage of each memory cell placed in an already erased state changes. When the erasing is found to be uncompleted upon the data determination in Step S15, the erase verify period bit EV is reset to "0", the erase period bit E is set to "1" as an alternative, and the write/erase en d flag FLAG is reset to "0" in the n ext Step S16.

Thus, the erasing is started in the flash memory unit when the booster circuit 31 starts boosting and the attained voltage detecting circuit 32 has detected that the boosted voltage has reached a target voltage. When the erase end detecting circuit 22 detects the end of erasing, the discharge & voltage attainment detecting circuit 33 starts the discharge of the booster circuit 31. When the completion of the discharge of the booster circuit 31 is detected, the write/erase end flag FLAG is set.

The CPU checks for the setting of the write/erase end flag FLAG after the erase period bit E has been set in Step S16 (Step S17). If the write/erase end flag FLAG is found not to have been set, then the CPU is held in standby as it is. When the write/erase end flag FLAG is found to have been set, the CPU returns to Step S14, where it sets the erase verify period bit EV of the control register CRG to "1" again and resets the erase period bit E to "0", thereby performing verify reading.

When the CPU determines read data and judges the erasing to be completed in Step S15, it proceeds to Step S18, where the erase verify period bit EV of the control register CRG is reset to "0", whereby a series of erasing processes are completed and hence the CPU proceeds to a post-erasing operation subsequent to Step S21.

In Step S21, the CPU sets the post erase period bit POSTE to "1" and starts a post erasing (weak or low writing) operation. Since processes subsequent to Step S22 are similar to those subsequent to Step S2 for the processing at the write operation, which is shown in FIG. 6, the description of common operations will be omitted. The following four points are different as follows: ① In Step S23, the erase verify period bit EV is set to "1" as an alternative to the write verify period bit PV, and the erase period bit E is reset to "0" in place of the write period bit. ② In step S25, the erase verify period bit EV is reset to "0" as an alternative to the write verify period bit PV, the erase period bit E is set to "1" in place of the write period bit, and the write/erase end flag FLAG is reset to "0". ③ In Step S26, data "0" is set in association with a bit to be post-erased, as an alternative to write data. ④ In Step S28, the erase verify period bit EV, the post erase period bit POSTE, and the write/erase end flag FLAG are reset to "0".

In the present embodiment as described above, the CPU may simply set or reset the respective bits of the control register CRG and needs not manage time attendant to the write or erase operation. When the writing or erasing is completed, the discharge & voltage attainment detecting circuit 33 of the flash memory unit sets the write/erase end flag FLAG as described above. Therefore, the CPU is capable of recognizing by going into the reading of the flag whether the writing or erasing has been finished.

Specific examples of boosting and writing/erasing circuits of the flash memory unit FLASH will next be explained.

Figure 8A:
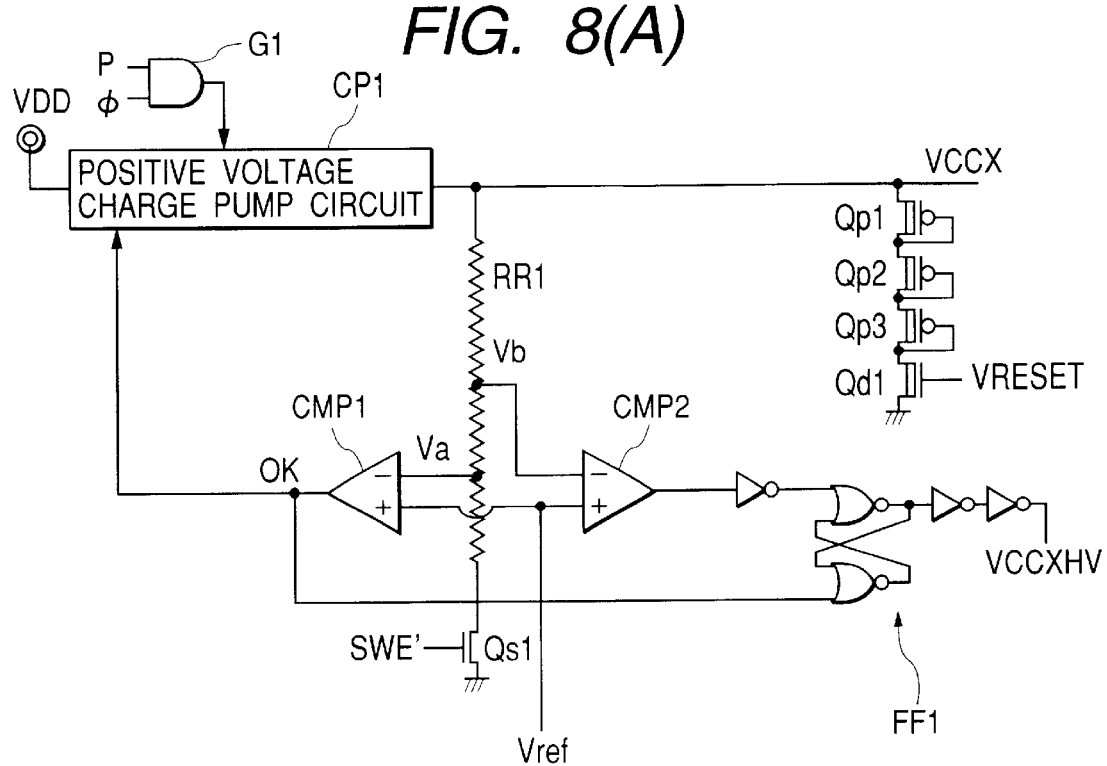
FIGS. 8A and 8B are circuits diagram illustrating examples of a booster circuit and an attained voltage detecting circuit provided in the flash memory unit employed in the embodiment.
Figure 8B:
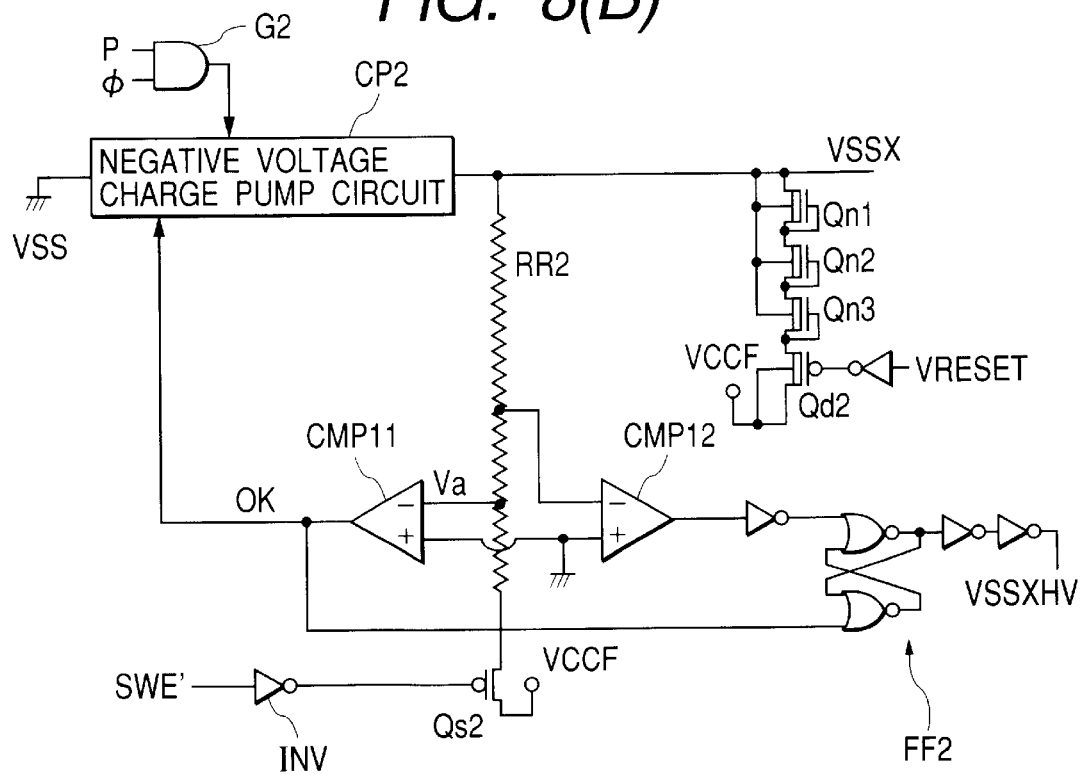
Figure 25:
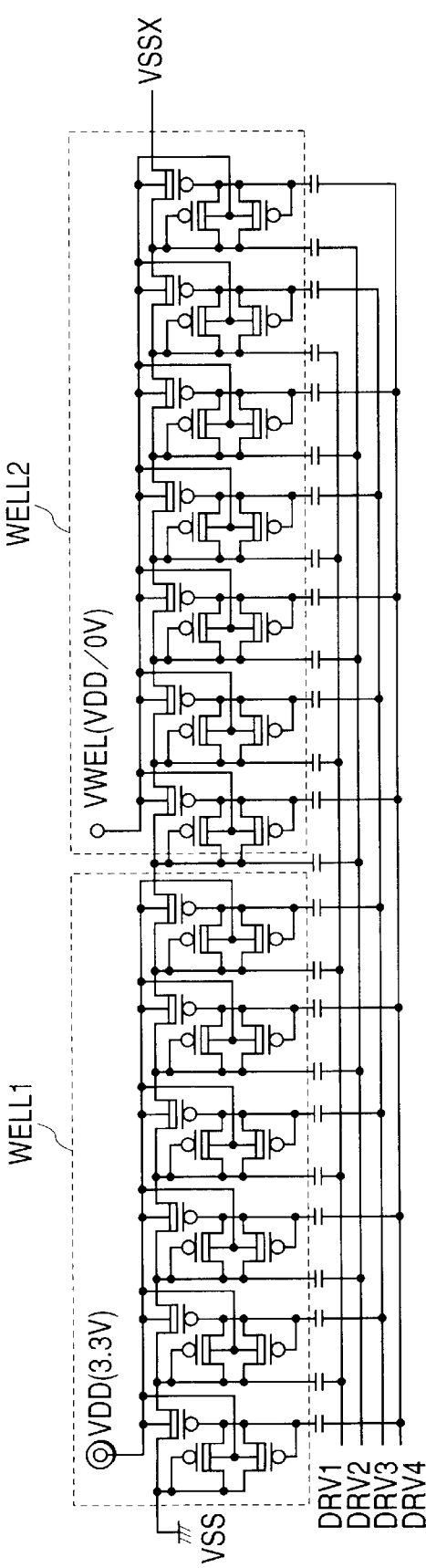
FIG. 25 is a circuit diagram showing an embodiment of a charge pump circuit of the flash memory to which the present invention is applied.

FIG. 8 shows examples of the attained voltage detecting circuit 32 and the discharge & voltage attainment detecting circuit 33. FIG. 8(A) in FIG. 8 illustrates an attained voltage detecting circuit and a discharge & voltage attainment detecting circuit used for a positive boosted voltage, and FIG. 8(B) in FIG. 8 shows an attained voltage detecting circuit and a discharge & voltage attainment detecting circuit used for a negative boosted voltage. In FIG. 8, CP1 indicates a charge pump circuit for generating a positive boosted voltage, and CP2 indicates a charge pump circuit for generating a negative boosted voltage. Each of the charge pump circuits CP1 and CP2 makes use of a circuit having such a configuration as shown in FIG. 25 by way of example, which taps capacitance according to clocks and sequentially transfers electrical charges to thereby perform boosting. Incidentally, since the charge pump circuit shown in FIG. 25 is identical in configuration to the known charge pump circuit, the detailed description of its configuration and operations will be omitted.

The attained voltage detecting circuit and discharge & voltage attainment detecting circuit shown in FIG. 8(A) comprises a ladder resistor RR1 and a switch MOSFET Qs1 connected in series form between an output terminal of the charge pump circuit CP1 and a ground potential, an attainment detecting comparator CMP1 for comparing a voltage Va divided by the ladder resistor RR1 and a reference voltage Vref to thereby detect whether a boosted voltage has reached a predetermined level, an attainment detecting comparator CMP2 for comparing a voltage Vb divided by the ladder resistor RR1 similarly and the reference voltage Vref to thereby detect whether a voltage has reached such a level as to stop the charge pump upon discharge (it is reduced to the level), a RS flip flop FF1 which is set and/or reset according to signals outputted from these comparators CMP1 and CMP2 to thereby output a voltage attainment signal VCCXVH, a discharge switch MOSFET Qd1, etc. The reference voltage Vref is a step-down or deboost stabilized voltage lower than a source voltage VDD generated, for example, inside a device, which does not change according to a voltage value of an external source voltage VDD.

Incidentally, it is necessary to be borne in mind that a sudden discharge voltage or post-discharge voltage is not excessively reduced upon the execution of discharge by the discharge switch MOSFET Qd1. To this end, in the present embodiment, a plurality of diode-coupled MOSFETs Qp1 through Qp3 are connected in series with the discharge switch MOSFET Qd1. Thus, a contrivance has been made so as to make it possible to avoid the occurrence of noise due to a sudden discharge and the application of a voltage greater than or equal to a withstand voltage to a device. Further, the post-discharge potential can be controlled by adjusting the number of stages for the diode-coupled MOSFETs Qp1 through Qp3.

The output VCCXVH of the flip flop FF1 is rendered low in level according to the output signals of the comparators CMP1 and CMP2 being both brought to a high level in an initial state. Further, the switch MOSFET Qs1 provided in series with the ladder resistor RR1 is configured so as to be controlled according to a signal SWE' based on the rewrite enable bit SWE lying within the control register CRG, which is applied to a gate terminal thereof.

The circuit shown in FIG. 8(A) is a circuit for generating a voltage VCCX like 10V applied to a selected word line upon writing. The attained voltage detecting circuit 32 and the discharge & voltage attainment detecting circuit 33 include a circuit for generating a voltage VCCW like 6V applied to the drain upon writing, a circuit for generating a voltage VCCZ like 11V applied to a control gate of each switch Z-SW for sub bit line selection, a circuit for generating a voltage VSSX like –2.5V applied to a non-selected word line, etc., except for the circuit for generating the voltage VCCX. Since the circuits for generating VCCW (6V) and VCCZ (11V), of these circuits are identical in configuration to the circuit shown in FIG. 8(A), their illustrations will be omitted. The circuit for generating the negative voltage VSSX (–2.5V) is configured as shown in FIG. 8(B).

The circuit shown in FIG. 8(B) has a configuration similar to that of the circuit shown in FIG. 8(A). The circuit shown in FIG. 8(B) is different from that shown in FIG. 8(B) in that a ladder resistor RR2 and a switch MOSFET Qs2 are connected between an output terminal of the charge pump circuit CP2 and a source voltage VCCF (1.4V), the MOSFET Qs2 is not an n channel but a p channel, and an inverter INV for inverting a signal SWE' applied to the gate of the MOSFET Qs2 is provided, a discharge switch MOSFET Qd2 is connected to the source voltage VCCF side other than a ground potential, and the ground potential is used as comparison voltages for comparators CMP11 and CMP12 as an alternative to the reference voltage. Incidentally, VCCF is a step-down or deboost stabilized voltage lower than a source voltage Vdd generated, for example, inside a device, which does not change according to a voltage value of an external source voltage Vdd.

Figure 9:
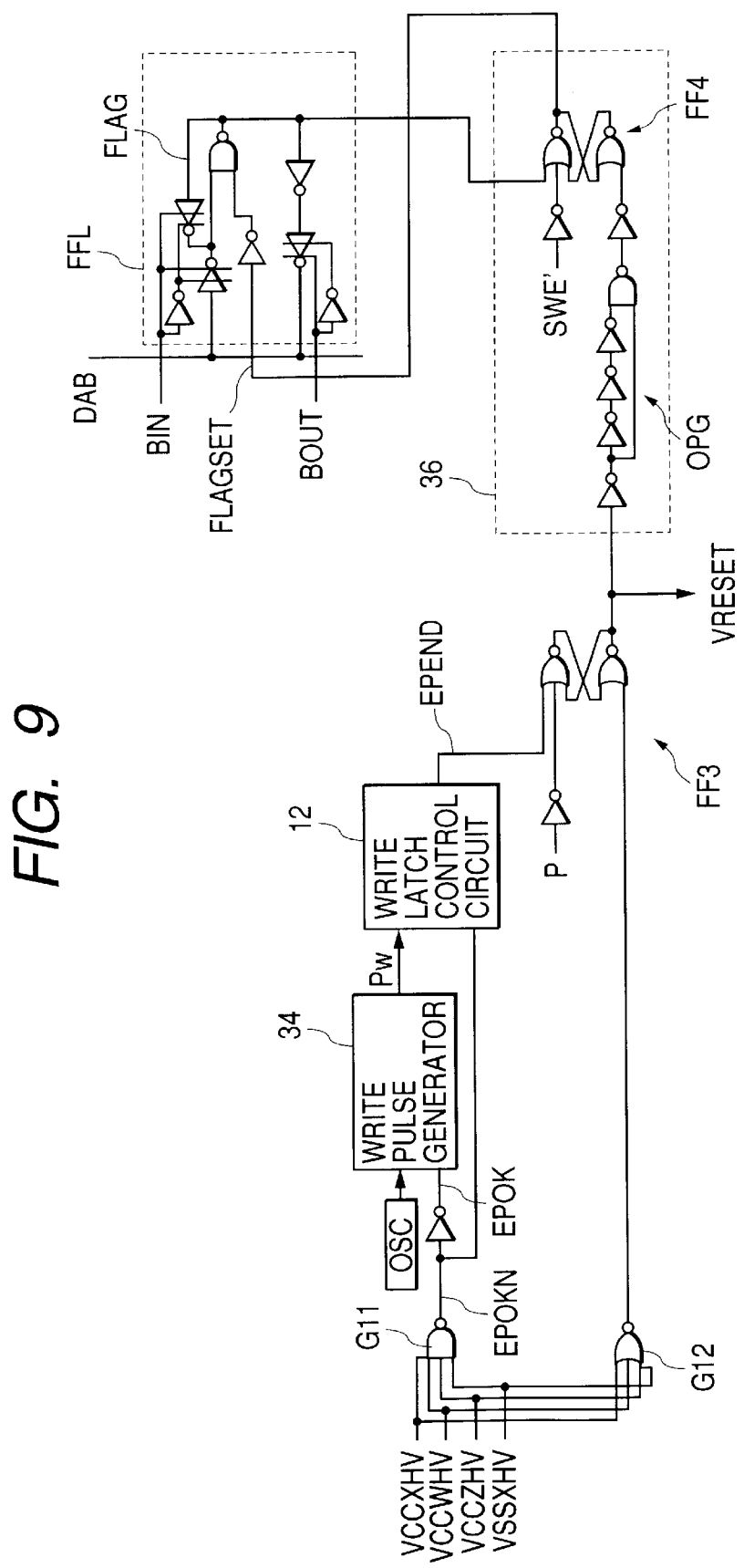
FIG. 9 is a circuit diagram showing one examples of an end flag provided in the flash mode controller employed in the embodiment and a circuit for setting the end flag.

The attainment detection signal VCCXHV detected by the circuit shown in FIG. 8(A) and attainment detection signals VCCWHV and VCCZHV detected by unillustrated similar circuits are ANDed by such a 4-input NAND gate G11 shown in FIG. 9 to thereby produce an enable signal EPOKN for a write pulse generator 34. A write/erase end flag FLAG lying within a control register CRG, and a flag set signal generator 36 for generating a signal VRESET for setting a flag are also shown in FIG. 9 together with a write latch control circuit 12.

Operations of the circuits shown in FIGS. 8(A) and 8(B) and the write pulse generator 34 shown in FIG. 9 will next be explained with reference to a timing chart shown in FIG. 10.

When the rewrite enable bit SWE of the control register CRG is first set, the switch MOSFET Qs1 is turned on in response to the signal SWE' based on the bit, so that preparations for comparison of the comparator CMP1 are made. Further, a sector address and data to be written are transferred to a write latch (timing t1). When the write period bit P is set subsequently, the AND gate G1 is opened to supply a clock $\phi$ to the charge pump circuit CP1, thereby starting a boosting operation of the charge pump circuit CP1 (timing t2). When the output voltage of the charge pump circuit CP1 has reached a target value 10V, the output of the comparator CMP1 is changed to a low level to stop the boosting operation of the charge pump circuit CP1 and change the output VCCXHV of the flip flop FF1 to a high level (timing t6).

Similarly, when a boosting start bit P is set with a timing t2 even in the circuit for generating the voltage VCCW applied to the drain, the circuit for generating the voltage VCCZ applied to the control gate of the switch Z-SW for the selection of each sub bit line, and the circuit shown in FIG. 8(B) for generating the negative voltage VSSX applied to each non-selected word line, the respective charge pump circuits start their boosting operations. When the output voltages thereof have reached their target values, the boosting operations of the charge pump circuits are stopped with their timings t3, t4 and t5 and the outputs VCCWHV, VCCZHV and VSSXHV of the circuits are respectively changed to a high level.

With the timing t6 at which all the detected signals are respectively changed to the high level, the enable signal EPOKN for the write pulse generator 34 is changed to a high level to start the generation of a write pulse. When writing for all the bits lying within one sector is thereafter completed, a discharge start signal VRESET corresponding to the output of a flip flop FF3 (see FIG. 9) is changed to a high level in response to a write end signal EPEND outputted from the write latch control circuit 12 (timing t7). Thus, the discharge switches MOSFETs Qd1 and Qd2 shown in FIGS. 8(A) and 8(B) are turned on to discharge the outputs of the charge pump circuits. When the comparators CMP2 and CMP12 have detected that boosted voltages are gradually lowered and have reached a predetermined level respectively, the outputs VCCHXV and VSSXHV of the flip flops FF1 and FF2, for example, are respectively changed to a low level.

With a timing t8 at which all the detected signals VCCXHV, VCCWHV, VCCZHV and VSSXHV are respectively changed to a low level, the output (discharge start signal) VRESET of the flip flop FF3 is changed to a low level according to the output of a NOR gate G12 for ANDing these signals, whereby writing is finished. Thereafter, the flag set signal generator 36 comprising a one-shot pulse generator OPG which inputs the discharge start signal VRESET therein, and a flip flop FF4, outputs a flag set pulse FLAGSET, whereby the write/erase end flag FLAG lying within the control register CRG is set.

Incidentally, a state signal SWE' of the rewrite enable bit SWE lying within the control register CRG is inputted to the other input terminal of the flip flop FF4 which constitutes the flag set signal generator 36 as shown in FIG. 9. While the signal SWE' is being fixed to a low level, the flip flop FF4 is brought to a reset state, whereby the output FLAGSET thereof is rendered in low so that the write/erase end flag FLAG is not set.

As shown in FIG. 9, the write/erase end flag FLAG employed in the present embodiment is connected so as to be capable of being inputted/outputted to a bus BUS according to a bus input timing signal BIN and a bus output timing signal BOUT and is set up so as to be capable of being read/written by the CPU. When the bus input timing signal BIN is raised as indicated by a timing t11 in a state in which the corresponding bit of the bus BUS is being fixed to a low level, the write/erase end flag FLAG takes in the signal on the bus BUS and is reset, so that its output FLAG' is changed to a low level.

Further, the output FLAG' of the write/erase end flag FLAG is fed back to the reset terminal side of the flip flop FF4. When the flip flop FF4 is set according to a signal outputted from the one-shot pulse generator OPG with the generation of the discharge start signal VRESET and the flag set signal FLAGSET is changed to a high level as indicated by a timing t12 to set the write/erase end flag FLAG, in a state in which the signal SWE' is brought to a high level, the output FLAG thereof is changed to a high level so that the flip flop FF4 is reset with the elapse of a suitable delay time Δt, whereby the flag set signal FLAGSET is caused to fall. Incidentally, other unillustrated bits of the control register CRG are also similarly constructed so as to be capable of being read/written via the bus BUS.

In the flash built-in micon according to the present embodiment as described above, when the attainment of the boosted voltage to the predetermined level is detected by hardware within the flash memory unit and the generation of the write pule is started, and the writing is further completed, the discharge is performed and the attained voltage caused by the discharge is detected to thereby stop the discharge. Therefore, even if the time required for boosting and the time required for discharge are different due to the difference in storage capacity of the flash memory, or the like, the microcomputer is operated so that the boosting and discharge are automatically completed correspondingly with the most suitable time. Therefore, the CPU needs not control such times as well as change programs according to products.

Figure 12:
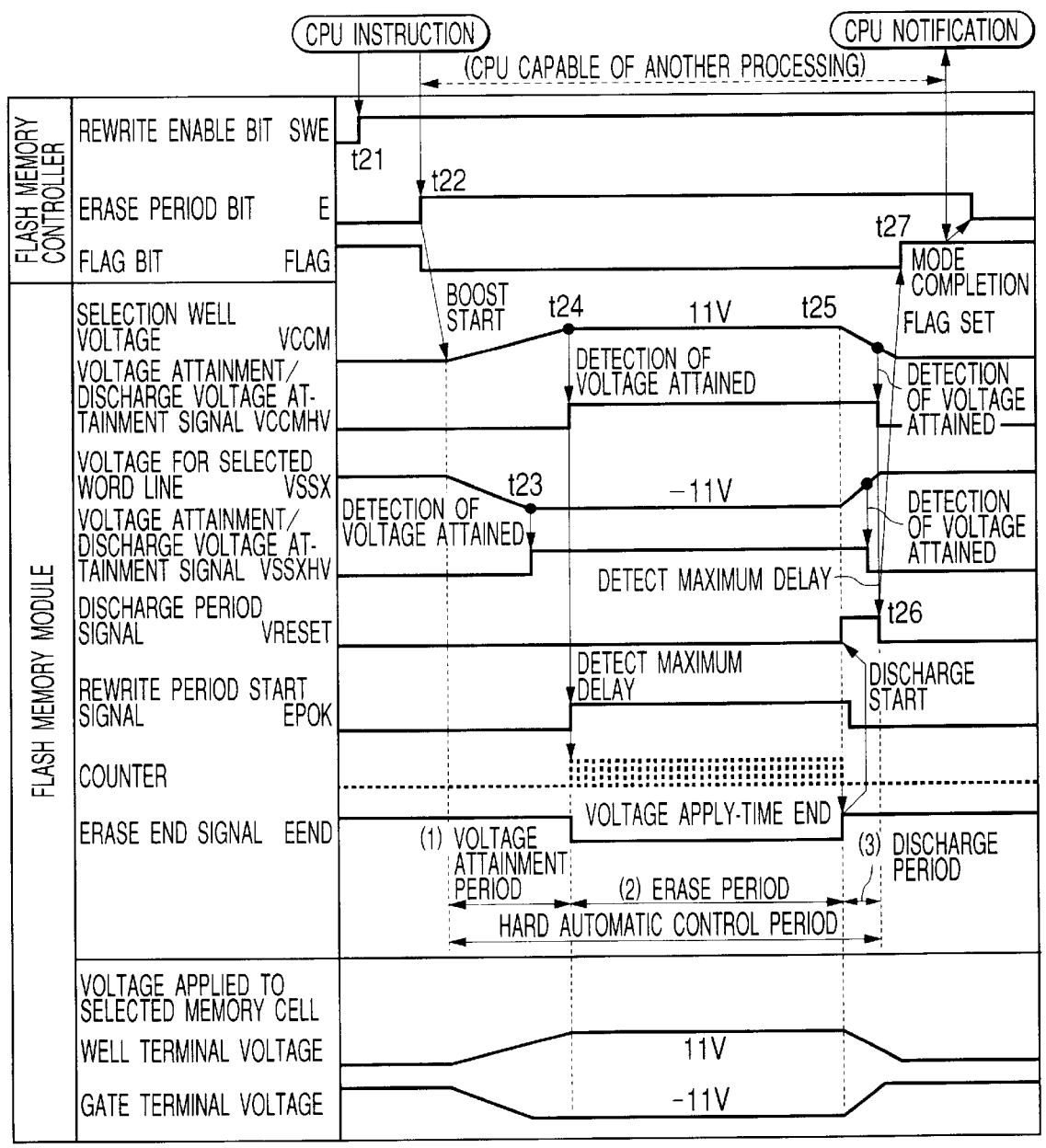
FIG. 12 is a timing chart for describing respective signals at an erase operation of the flash memory unit employed in the embodiment.

The erase operation of the flash memory unit employed in the present embodiment will next be described with reference to FIG. 12. In addition to such circuits as shown in FIGS. 8(A) and 8(B) for generating the voltages necessary for the write operation, a circuit for generating a selection well voltage VCCM like 11V necessary for the erase operation, and a circuit for generating a negative voltage VSSX like –11V applied to each selected word line are provided within the booster circuit 31 shown in FIG. 5. The circuit for generating the selection well voltage VCCM, of these circuits comprises such a circuit as shown in FIG. 8(A), having the charge pump circuit and the comparator or the like, and the circuit for generating the negative voltage VSSX is made up of such a circuit as shown in FIG. 8(B), respectively. However, the circuit for generating the selection well voltage VCCM and the circuit for generating the voltage VSSX applied to the selected word line may double as the circuits of FIGS. 8(A) and 8(B) for respectively switching between terminal positions on the resistors across which the comparison voltages Va are applied to thereby generate the writing boosted voltages referred to above. Incidentally, a booster circuit for generating a voltage like 4V applied to each selected word line upon post-erasing and a booster circuit for generating a voltage like –5V applied to each non-selected word line upon post-erasing may double as the circuits shown in FIGS. 8(A) and 8(B) in a manner similar to the above.

When the rewrite enable bit SWE of the control register CRG is first set upon the erase operation (timing t21), preparations for comparison by the comparator in each booster circuit are carried out according to the signal SWE' based on the bit. When the erase period bit E is set subsequently, clocks are supplied to the charge pump circuits of the selection well voltage VCCM generating circuit and the negative voltage VSSX generating circuit to start their boosting operations (timing t22). When voltages outputted from the charge pump circuits have reached target values of 11V and –11V respectively, the outputs of the comparators change and hence the boosting operations of the charge pump circuits are stopped. Further, voltage-attainment detected signals VCCMHV and VSSXHV are respectively changed to a high level (timings t23 and t24).

With the timing t24 at which the two detected signals VCCMHV and VSSXHV have been changed to the high level, an enable signal EPOK for the apply-time control circuit 21 shown in FIG. 5 is changed to a high level to start the application of erase voltages (selection well voltage VCCM and selected word line voltage VSSX). Thereafter, when the apply-time control circuit 21 determines the completion of a voltage apply-time through the use of an internal counter or the like, an erase end signal EEND outputted from the apply-time control circuit 21 changes, and a discharge start signal VRESET is outputted from the erase end detecting circuit 22 for monitoring the erase end signal EEND, whereby the discharge & voltage attainment detecting circuit 33 starts the discharge of the boosted voltage of each charge pump circuit (timing t25). Thus, the booster circuits 31 discharges the outputs of the corresponding charge pump circuits. When the comparators have detected that the boosted voltages are gradually lowered to reach predetermined levels, voltage-attainment detected signals VCCMHV and VSSXHV are respectively changed to a low level.

With a timing t26 at which the two detected signals VCCMHV and VSSXHV are respectively brought to the low level, the discharge start signal VRESET is changed to a low level, so that a flag set signal generator 36 comprising a one-shot pulse generator OPG and a flip flop FF4 similar to FIG. 9 outputs a flag set pulse FLAGSET, whereby a write/erase end flag FLAG lying within a control register CRG is set and hence a state signal FLAG of the flag is changed to a high level, thereby leading to the completion of the erase operation (timing t27).

As described above, the flash built-in micon according to the present embodiment detects that the boosted voltage has reached the predetermined level on the hardware basis within the flash memory unit even upon erasing, and starts erasing. Further, when the erasing is completed, the microcomputer performs the discharge and detects the voltage attained according to the discharge to stop the discharge, thereby leading to the completion of the erase operation. The CPU can check for the write/erase end flag FLAG to thereby recognize whether the erasing has been finished.

Specific examples of the write latch control circuit 12 and the write end detecting circuit 35 will next be explained with reference to FIG. 13. In the flash memory unit employed in the present embodiment, bits corresponding to data "1" are skipped over and write pulses are sequentially applied only to bit lines corresponding to data "0".

Figure 13:
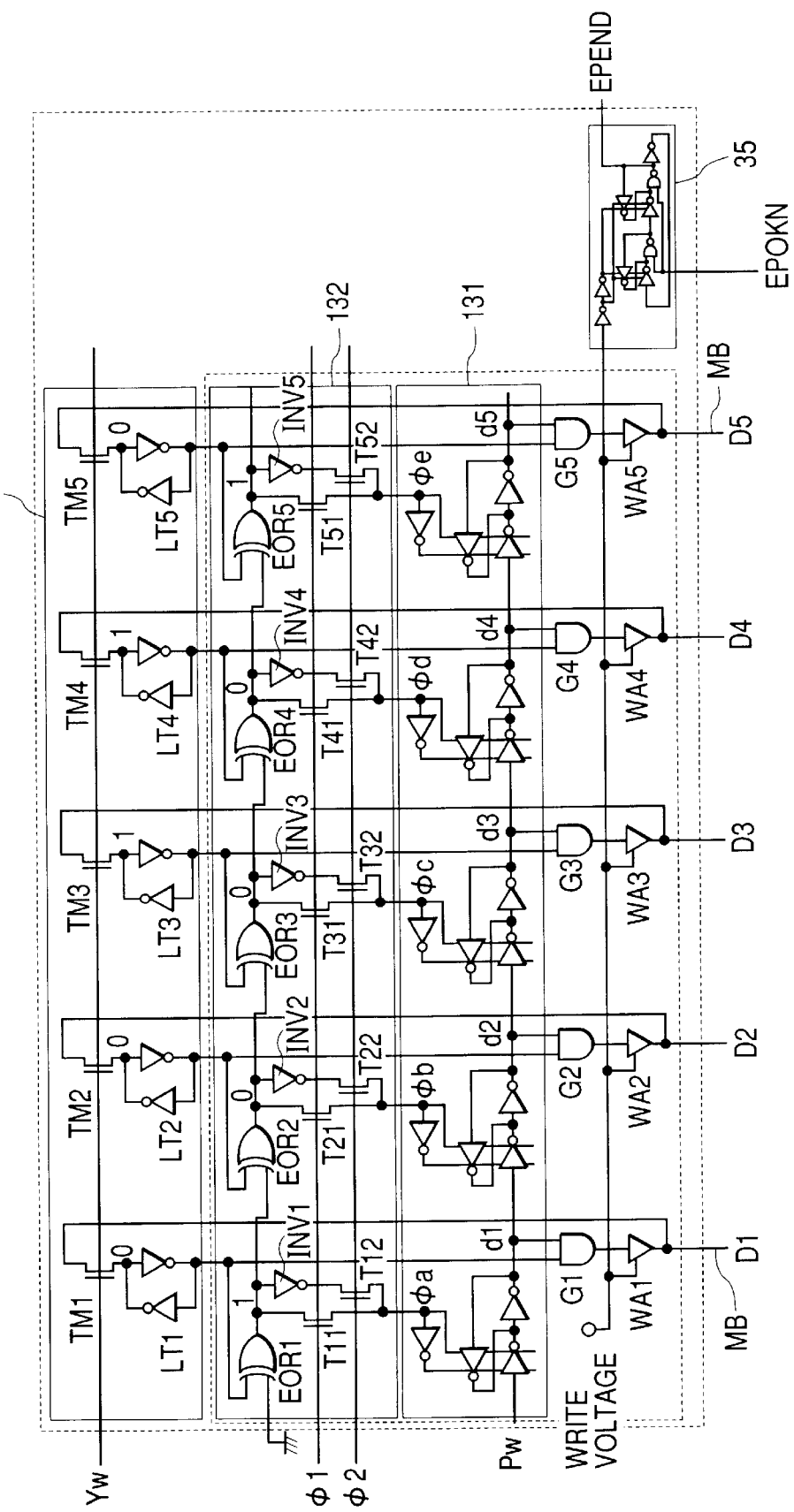
FIG. 13 is a circuit diagram showing specific examples of a write control circuit and a write end detecting circuit used in the flash memory unit employed in the embodiment.

As shown in FIG. 13, a data register 12A comprises transmission MOSFETs TM1, TM2, TM3, . . . for respectively taking in or capturing respective bits for write data inputted from the bus through bit lines MB, and latches LT1, LT2, LT3, . . . each comprising a pair of inverters whose input/output terminals are connected to one another. Further, the write control circuit 13 comprises a shift register 131 for write control, a data determination & shift control circuit 132 for determining whether the respective bits for the write data latched in the data register 12A are "1" or "0" and correspondingly controlling shift operations of respective stages of the shift register 131, AND gates G1, G2, G3, . . . for receiving shift clocks sent from the data determination & shift control circuit 132 and data held or retained in the respective latches LT1, LT2, LT3, . . . of the data register 12A as inputs respectively, and write amplifiers WA1, WA2, WA3, . . . for driving their corresponding bit lines MB in response to the outputs of the AND gates G1, G2, G3, . . . with a write voltage Vpp like 10V as a source voltage.

The data determination & shift control circuit 132 comprises exclusive OR gates EORi for respectively receiving the data held in the latches LT1, LT2, LT3, . . . of the data register 12A as one inputs and receiving outputs sent from the preceding stages as the other inputs, inverters INVi for respectively inverting the outputs of the exclusive OR gates EORi, and transmission MOSFETs Ti1 and Ti2 for respectively alternatively selecting the outputs of the inverters INVi or the outputs of the exclusive OR gates EORi according to clocks $\phi1$ and $\phi2$ and supplying them to the respective stages of the shift register 131 as shift clocks.

Incidentally, the initial-stage exclusive OR gate EOR1 of the exclusive OR gates EORi corresponding to the respective stages has one input terminal to which a ground potential is applied as an alternative to the input of the output of the preceding-stage exclusive OR gate EOR(i−1). Thus, the initial-stage exclusive OR gate EOR1 produces an output signal as "1" when the data held in the latch LT1 of the data register 12A is "0", and produces an output signal as "0" when the data retained in the latch LT1 is "1". Further, the exclusive OR gates EORI subsequent to the second stage invert and output the outputs of the preceding-stage exclusive OR gates EOR(i−1) when the data held in their corresponding latches LTi are "0". When the data held in the latch LT1 is "1", the output of the preceding-stage exclusive OR gate EOR(i−1) is outputted as it is.

Figure 14:
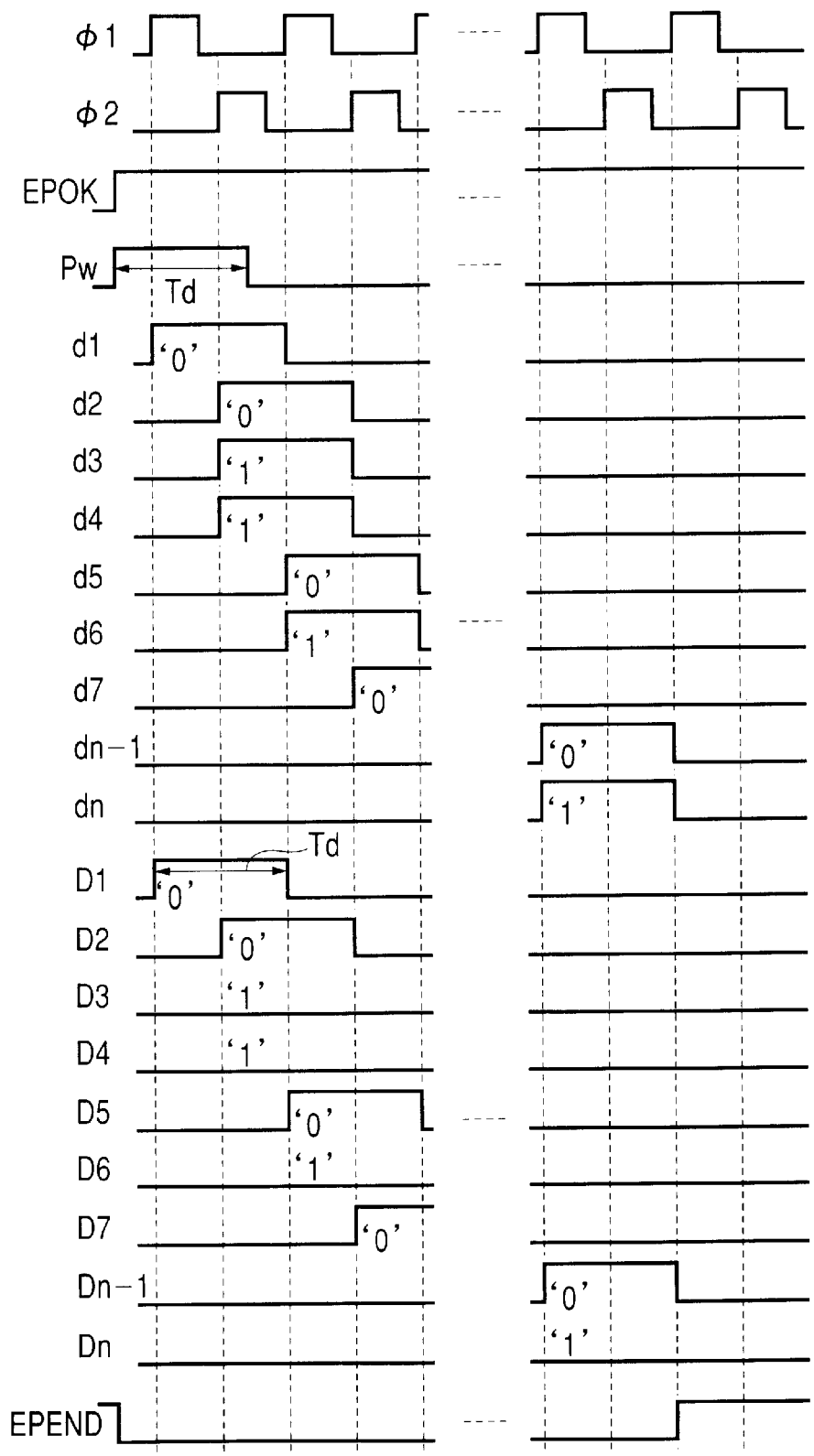
FIG. 14 is a timing chart for describing timings provided for respective signals employed in the write control circuit shown in FIG. 13.

The clocks $\phi1$ and $\phi2$ for controlling the clock transmission MOSFETs Ti1 and Ti2 of the data determination & shift control circuit 132 are respectively clocks whose high level periods are set so as not to overlap one another and which are 180°0 out-of-phase as shown in FIG. 14. Thus, the respective stages of the shift registers 131 for the write control are respectively supplied with clocks (e.g., $\phi$a and $\phi$e in FIG. 13) which are respectively changed to a high level in synchronism with the leading edge of the clock $\phi1$ when the outputs of their corresponding exclusive OR gates EORi are high in level, and which are respectively changed to a low level in synchronism with the rising edge of the clock $\phi2$. When the outputs of the corresponding exclusive OR gates EORi are low in level, the respective stages thereof are respectively supplied with clocks (e.g., $\phi$b, $\phi$c, $\phi$d in FIG. 13), which are respectively changed to a high level in synchronism with the rising edge of the clock $\phi2$ and changed to a low level in synchronism with the rising edge of the clock $\phi1$.

A master write pulse Pw having a pulse width Td corresponding to nearly one period or cycle of the clock $\phi1$, for example, as shown in FIG. 14 is inputted to the initial stage of the shift register 131. The write pulse Pw is sequentially transferred from the preceding stage to the subsequent stages according to the clocks $\phi$a, $\phi$b, $\phi$c, $\phi$d, $\phi$e, . . . sent from the data termination & shift control circuit 132. In the case of the continuous clocks (e.g., $\phi$b, $\phi$c, $\phi$d) which change with the same timing, racing occurs between the adjacent respective stages of the shift register 131, so that the pulse inputted to the initial stage is latched in all the subsequent stages. Waveforms designated at signs d1 through dn in FIG. 14 respectively indicate outputs produced from the respective stages of the shift register 131, and waveforms designated at signs D1 through Dn respectively indicate write pulses applied to their corresponding bit lines MB. Incidentally, the write pulses applied to the bit lines MB are applied to their corresponding sub bit lines SB through selection switches MOSFETs Z-SW.

In the case of data corresponding to bits of "0", of write data as indicated by the waveforms designated at signs d1 through dn in FIG. 14, transmission write pulses are delayed by a half cycle of the clock $\phi1$ ($\phi2$). In the case of data corresponding to bits of "1", of the write data, the transmission write pulses are respectively transmitted without their delays. As a result, the write pulses applied to their corresponding bit lines become pulses sequentially shifted by a half cycle of the clock $\phi1$ ($\phi2$) as indicated by the waveforms designated at signs D1 through Dn in FIG. 14.

As described above, the bits corresponding to the data "1" are skipped over and the write pulses are sequentially applied only to the bit lines corresponding to the data "0". Thus, the total write time is shortened by the number of bits corresponding to the data "1" as compared with the conventional system wherein the writing is carried out without skipping of the bits corresponding to the data "1". Correspondingly, a change in the sum Iw of write currents becomes also low as compared with the conventional system. As a result, the load on each booster circuit becomes uniform and hence fluctuations in boosted voltage are reduced, thereby making it possible to carry out stable writing. When variations in write current are large, it is necessary to design a booster circuit in advance so that it be capable of coping with the variations. However, when the variations in write current are low, the design of the booster circuit becomes easy.

The write end detecting circuit 35 shown in FIG. 13 comprises latches which input a write pulse having reached the final stage of the shift register 131 and a rewrite enable signal EPOKN supplied from the aforementioned attained voltage detecting circuit 32. The write end detecting circuit 35 is operated in such a manner that when the rewrite enable signal EPOKN is changed to a high level, the output thereof is changed to a low level, and when the corresponding write pulse has reached the final stage of the shift register 131, the write end detecting circuit 35 latches the rewrite enable signal EPOKN as a trigger signal and inverts the output thereof, thereby changing the output to a high level. Thus, the write end detecting circuit 35 outputs a write end detection signal EPEND brought to a low level between the start of writing and the completion thereof. The signal EPEND is supplied to the flip flop FF3 shown in FIG. 9 to thereby form a discharge start signal VRESET for. each booster circuit shown in FIG. 8.

Figure 15:
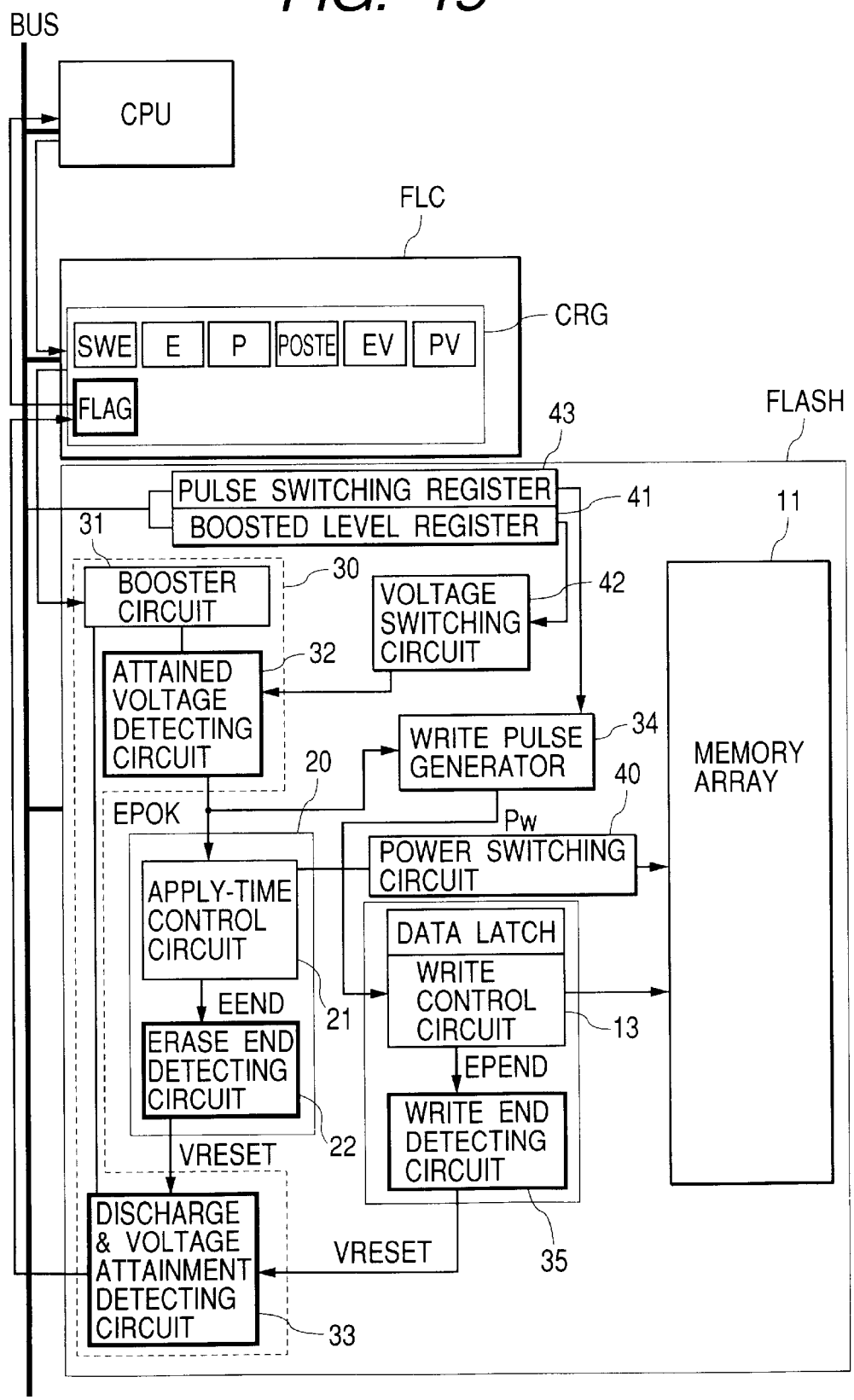
FIG. 15 is a block diagram showing the outline of another embodiment of a flash built-in micon to which the present invention is applied.

FIG. 15 shows another embodiment of a flash memory unit FLASH employed in a flash built-in micon to which the present invention is applied.

The present embodiment is provided, within the flash memory unit, with a boosted level setting register 41 for setting each boosted level designation code used for adjusting a boosted level of the booster circuit 31 according to instructions issued from the CPU, a comparison voltage switching circuit 42 for switching between the comparison voltages Va for the comparators CMP1 and CMP11 of the booster circuits shown in FIG. 8 according to the set codes, and a pulse width setting register 43 for setting a pulse width designation code for adjusting the width of each write pulse referred to above according to instructions issued from the CPU.

Figure 16:
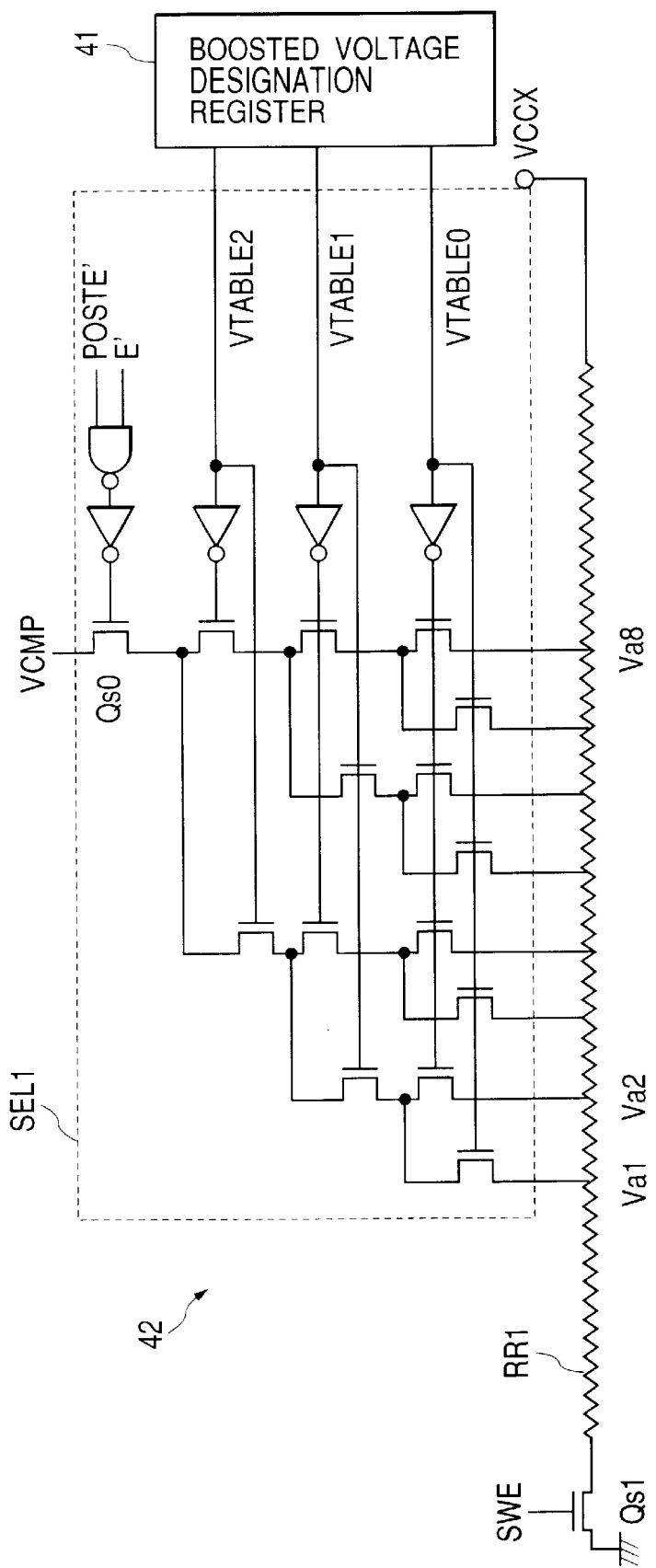
FIG. 16 is a circuit diagram showing embodiments of both a boosted level setting register for adjusting a boosted level employed in the booster circuit lying in the flash memory unit, and a comparison voltage switching circuit for selecting a comparison voltage according to a set code.

A specific example of the comparison voltage switching circuit 42 is shown in FIG. 16. In FIG. 16, designated at RR1 is the ladder resistor shown in FIG. 8(A). In the present embodiment, voltages Va1, Va2, . . . Va8 obtained by dividing a boosted voltage VCCX at an arbitrary resistance ratio from plural points of the ladder resistor RR1 are extracted, and any of these voltages, which corresponds to a code set by the boosted level setting register 41 for setting a boosted level designation code by a selector circuit or selector SEL1 comprising switch MOSFETs constructed in pyramid form, is extracted or taken out and supplied as a comparison voltage VCMP for the comparators CMP1 and CMP11.

A switch MOSFET Qs0 controlled by a signal obtained by ANDing signals from a post erase period bit POSTE and an erase period bit E lying within a control register CRG is also provided in the selector SEL1. Incidentally, this circuit indicates, as one example, an example of the comparison voltage switching circuit 42 in the booster circuit for generating a voltage applied to each selected word line upon post-erasing. In the booster circuit for generating a voltage used for a write operation, a signal from a write period bit P is supplied to the gate of the switch MOSFET Qs0. In the booster circuit for generating a voltage used for an erase operation, a signal from an erase period bit E is supplied to the gate of the switch MOSFET Qs0.

Incidentally, FIG. 16 shows a case in which the boosted level designation code is 3 bits as one example. However, the boosted level designation code is not limited to it but may be 2 bits or 4 bits or more. Further, the selector SEL1 may be controlled based on a signal obtained by decoding each of codes of the register 41 by means of a decoder as an alternative to the direct control of the selector SEL1 by each code of the register 41.

Figure 17:
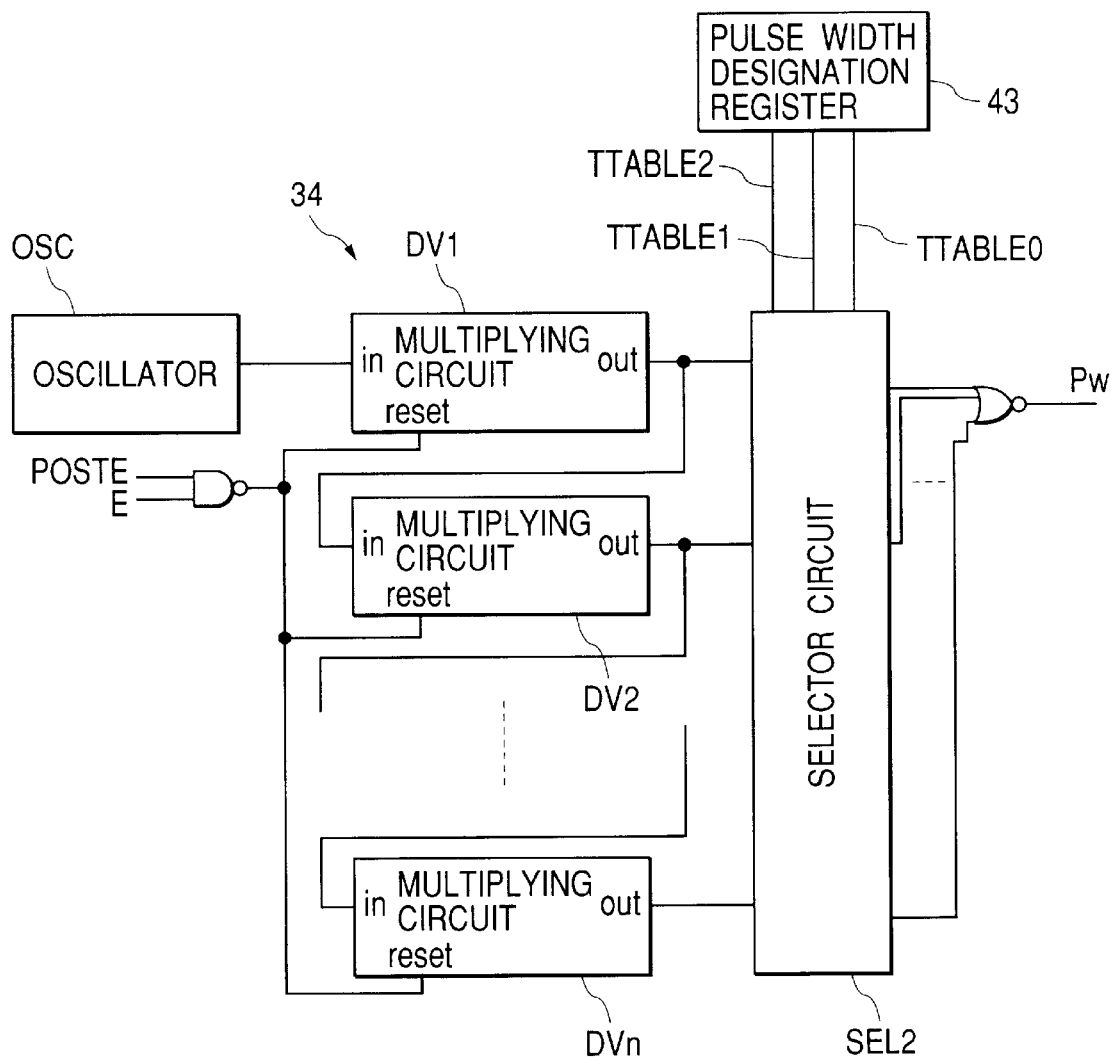
FIG. 17 is a block diagram showing one example of a write pulse generator.

A specific example of a write pulse generator 34 at the time that a pulse width designation code setting register 43 is provided, is shown in FIG. 17. The write pulse generator 34 employed in the present embodiment comprises a plurality of multiplying circuits DV1, DV2, . . . DVn for respectively generating clocks having frequencies obtained by multiplying the frequency of a reference oscillation signal φ0 produced from an oscillator OSC in response to the reference oscillation signal φ0, a selector circuit or selector SEL2 for selecting a clock corresponding to a code set to the pulse width setting register 43 from the clocks multiplied by these multiplying circuits, etc. As an alternative to the selector SEL2 for selecting any one of the clocks, such a clock combination circuit that arbitrary clocks are utilized in combination to thereby generate a clock having a desired pulse width, may be used.

Even in the present embodiment, multiplying circuits DV1, DV2, . . . DVn are configured so as to be controlled according to a signal obtained by ANDing signals from a post erase period bit POSTE and an erase period bit E lying within a control register CRG, whereby the width of a write pulse Pw generated according even to an operation mode is adjusted. Incidentally, FIG. 17 shows a case in which a pulse width designation code is 3 bits as one example. However, the pulse width designation code is not limited to it and may be 2 bits or 4 bits or more. Further, the selector SEL2 may be controlled based on a signal obtained by decoding each of codes of the register 43 by means of a decoder as an alternative to the direct control of the selector SEL2 by each code of the register 43. There is also considered a circuit for changing a pulse width through the use of a divider circuit in place of the multiplying circuits.

Figure 18:
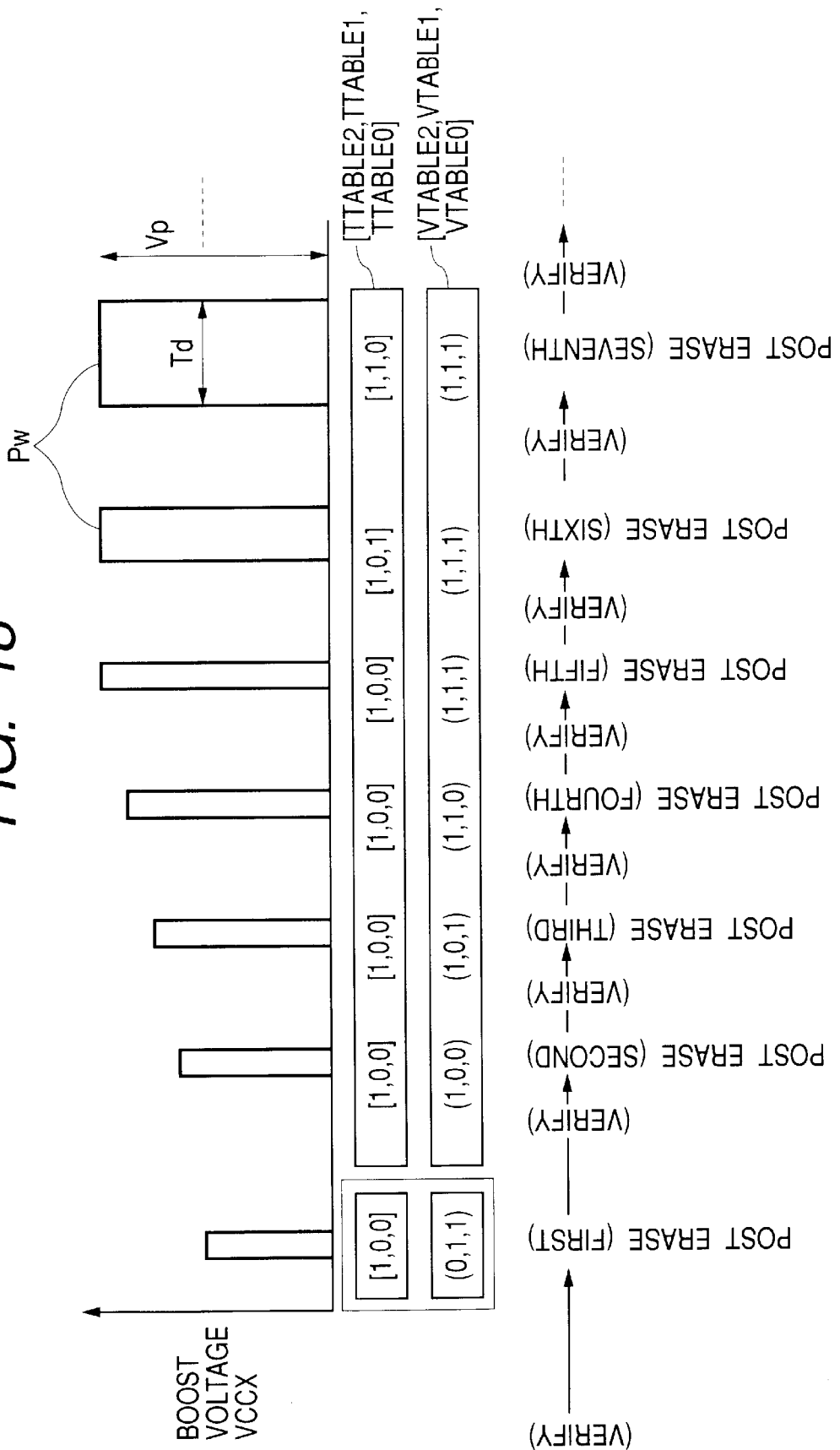
FIG. 18 is a waveform chart illustrating the relationship among codes set to the boosted level setting register, codes set to a pulse width setting register, and write pulses.

In the present embodiment, the CPU dynamically rewrite or updates the codes of the boosted voltage setting register 41 and the pulse width setting register 43 so as to be capable of applying the write pulses most suitable for the respective conditions to their corresponding memory cells. FIG. 18 shows, as one example, the manner of changes in write pulses Pw generated when respective codes are rewritten or updated upon post-erasing. In the drawing, the lowermost column indicate boosted voltage designation codes, and the column thereabove indicates write pulse designation codes.

It is understood from FIG. 18 that when each of boosted voltage designation codes is changed, a height Vp of a write pulse Pw changes, and when each of write pulse designation codes is changed, a width Td thereof changes. The reason why the voltage and width of the write pulse gradually increase in FIG. 18, is that a threshold voltage of each memory cell becomes hard to change as the threshold voltage approaches a target value. The way of changing each write pulse in FIG. 18 is strictly illustrated as one example but may be determined according to the characteristics of each storage device or element to be used.

Further, each of storage elements constituting a flash memory might be shifted in optimum write time according to variations in manufacture. However, the write processing can be carried out in time corresponding to the characteristic of each device by the change in the width of each write pulse as described above.

While the above has been described with the post-erasing as the example, a pulse width and a pulse voltage value may be changed upon writing or erasing.

Figure 19:
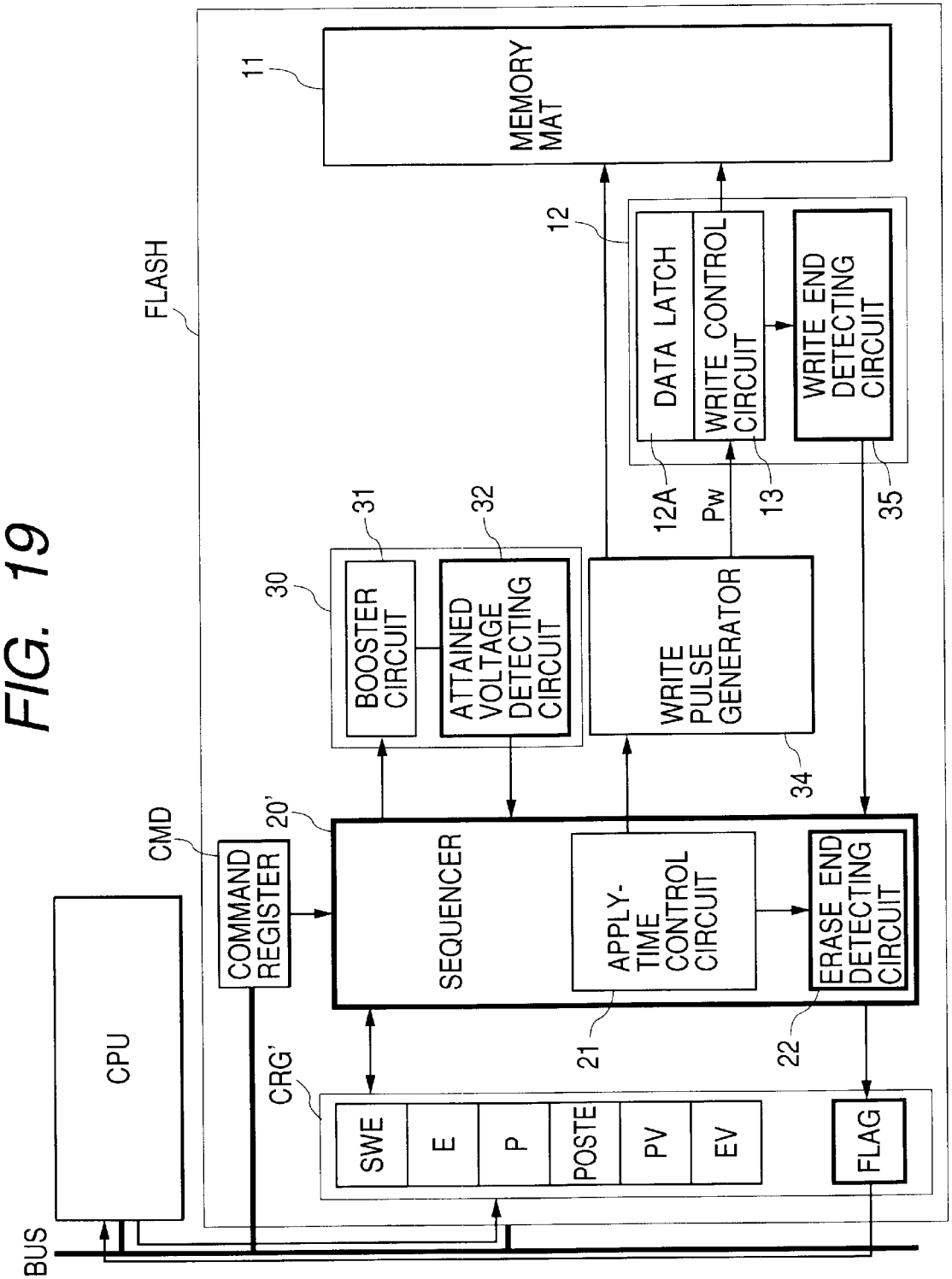
FIG. 19 is a block diagram showing the outline of one embodiment of a flash memory chip to which the present invention is applied.

FIG. 19 shows a further embodiment of the present invention. The present embodiment is one wherein the present invention is applied to a so-called flash memory chip constructed on a semiconductor substrate provided discretely from a CPU, as a semiconductor integrated circuit. The flash memory chip shown in FIG. 19 has a configuration similar to the flash memory unit according to the embodiment (see FIG. 5), which is built in the microcomputer chip. In FIG. 19, circuit blocks having functions identical or similar to those of the circuit blocks shown in FIG. 5 are respectively identified by the same reference numerals and the description of certain common ones will therefore be omitted.

A big difference between the embodiment shown in FIG. 19 and the embodiment shown in FIG. 5 resides in that in the embodiment shown in FIG. 5, the CPU sets the respective bits of the control register CRG to provide instructions as to the operation for the flash memory unit, whereas in the embodiment shown in FIG. 19, the flash memory chip is provided thereinside with a command register CMD and a sequencer (control circuit) 20', and when the external CPU sets a command to the command register CMD, the sequencer 20' interprets the command to thereby control the operation of the flash memory unit. The embodiment shown in FIG. 19 is different from the embodiment shown in FIG. 5 even in that a control register CRG' similar to the control register CRG provided in the flash mode controller FLC in the embodiment shown in FIG. 5 is provided and the present control register CRG' cannot be set and reset by the external CPU but can be set and reset by the sequencer 20'. The embodiment shown in FIG. 19 is substantially similar to the embodiment shown in FIG. 5 in configurations other than the above. Incidentally, an attained voltage detecting circuit 32 in FIG. 19 includes the discharge & voltage attainment detecting circuit 33 shown in FIG. 5.

While FIG. 19 is illustrated in simplified form in association with FIG. 5, memory peripheral circuits such as an address decoder, a sense amplifier, etc. are actually provided in a manner similar to the flash memory unit FLASH shown in FIG. 2. Although not restricted in particular, the command register CMD is configured so that command codes indicative of instructions for writing, erasing, etc. can be set by the CPU through an external data bus. When a command code is set to the command register CMD, the sequencer 20' interprets the command and starts the corresponding control operation.

In a manner similar to the control register employed in the embodiment shown in FIG. 5, the control register CRG' includes a rewrite enable bit SWE for declaring or manifesting an entry into a rewrite mode, an erase period bit E for giving instructions as to an erase period, a write period bit P for providing instructions as to a write period, a post erase period bit POSTE for providing instructions as to a post-erasing period, an erase verify period bit EV for providing instructions as to an erase verify period, a write verify period bit PV for providing instructions as to a write verify period, and an end flag FLAG indicative of the end of writing and erasing.

In the present embodiment as described above, the respective bits of the control register CRG' except for the end flag FLAG cannot be set and reset by the CPU, whereas the end flag FLAG can also be reset and read by the CPU through a data bus DBS. However, a terminal for directly notifying the state of the write/erase end flag FLAG to the CPU may be provided.

In the flash memory chip according to the present embodiment, the sequencer 20' generates internal control signals for a power circuit 30, a write pulse generator 34, an unillustrated address decoder, etc. lying inside the chip according to the set states of the bits of the control register CRG while the bits are being set and reset, whereby operations such as writing, erasing and reading are performed. The sequencer 20' is provided with a ROM (Read Only Memory) with a series of microinstruction groups necessary for the execution of, for example, commands being stored therein. A command decoder generates a leading address of a microinstruction group corresponding to a command and supplies it to the control circuit 20', whereby the microinstructions are sequentially executed to thereby form control signals for the respective circuits lying inside the chip.

Figure 20:
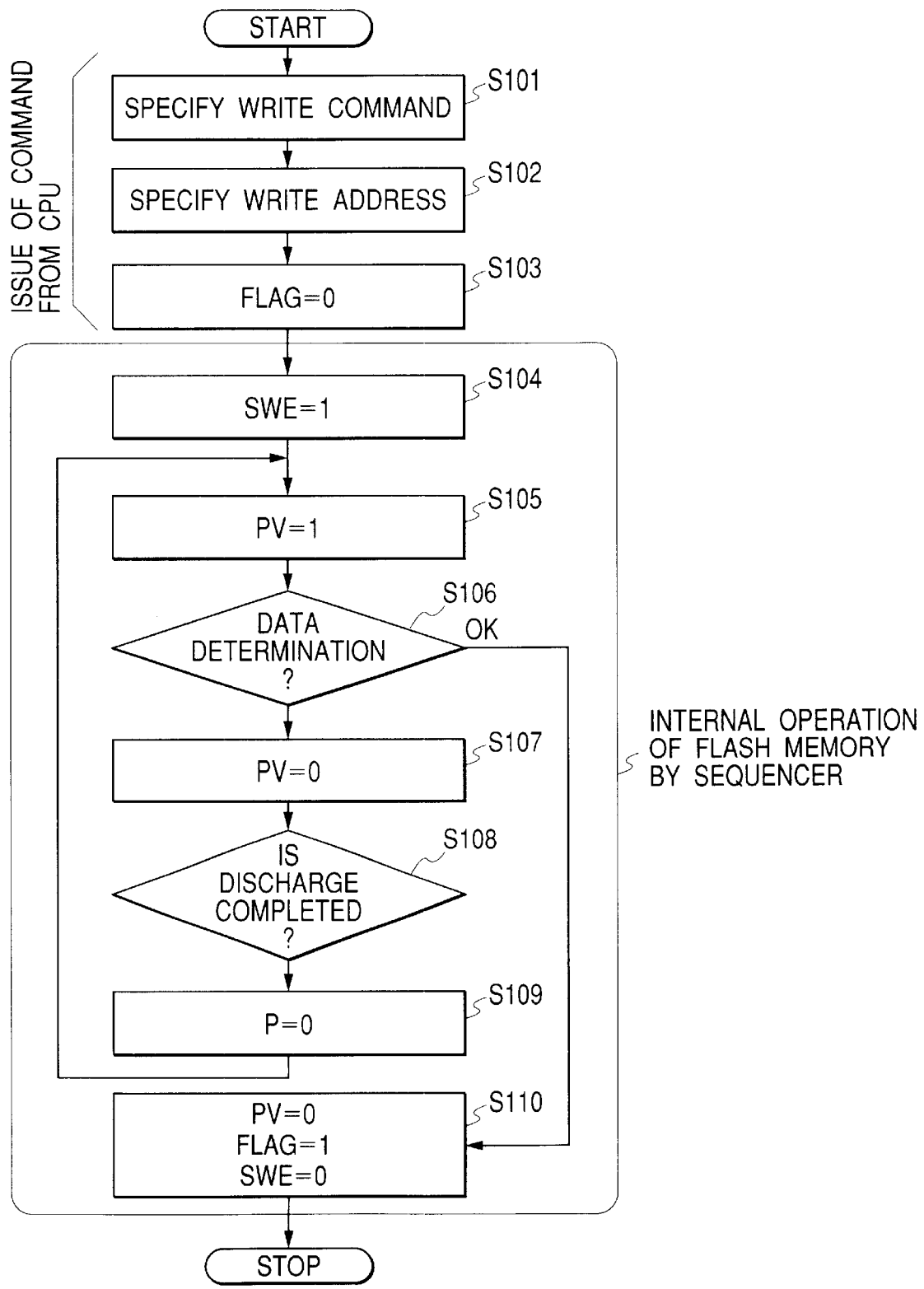
FIG. 20 is a flowchart showing a write procedure employed in a flash memory according to the embodiment shown in FIG. 19.
Figure 21:
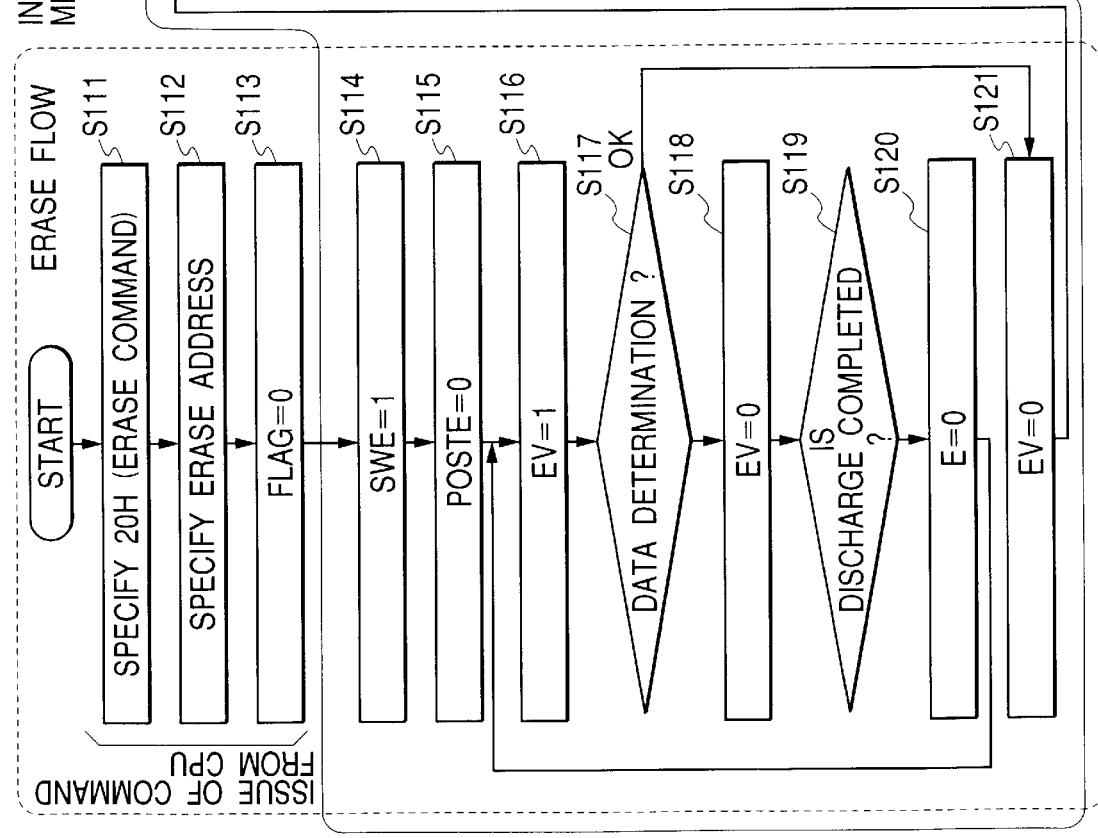
FIG. 21 is a flowchart illustrating an erase procedure employed in the flash memory according to the embodiment shown in FIG. 19.

FIGS. 20 and 21 respectively show writing and erasing procedures inside the flash memory chip by the sequencer 20' where command codes are given from the CPU. The flash memory chip according to the present embodiment is operated in such a manner that when the CPU sets a command code to the command register CMD and specifies an address therefor through the data bus, the sequencer effects writing or erasing on each memory cell and thereafter performs verify reading continuously. When the verify operation is completed, the sequencer is operated so as to set the write/erase end flag FLAG to "0" and notify it to the CPU.

When the CPU sets a write command, a write address and write data to the flash memory unit and resets the write/erase end flag FLAG to "0" (Steps S101 through S103) as shown in FIG. 20, the sequencer 20' is started up to perform write operation control according to a procedure of Steps S104 through S110.

The sequencer 20' first sets the rewrite enable bit SWE of the control register CRG to "1" (Step S104). Next, the sequencer 20' sets the write verify period bit PV of the control register CRG to "1" (Step S105). Thus, data corresponding to the address specified by the CPU in Step S102 is read from a memory array within the flash memory unit.

The sequencer 20' compares the read data with write data to thereby determine whether they have coincided with each other (Step S106). When the writing is found to be uncompleted from the data determination, the sequencer 20' resets the write verify period bit PV to "0" and sets the write period bit P to "1" in the following Step S107. Thus, the booster circuit 31 starts boosting. Thereafter, the generation of a write pulse from the write pulse generator 34 according to an attainment detection signal outputted from the attained voltage detecting circuit 32, the application of a write pulse to each bit line by the write latch control circuit 12, and the detection of write completion by the write end detecting circuit 35 are automatically advanced.

In step S108, the sequencer 20' monitors a detected signal outputted from the discharge & voltage attainment detecting circuit 33 and determines whether the discharge is finished. When the discharge is found to have been finished, the sequencer 20' resets the write period bit P to "0" in the next Step S109 and returns to Step S105, where the above-described operation is repeated. When it is found from the verify data determination in Step S106 that the data have coincided with each other, the sequencer 20' proceeds to Step S110, where it resets the verify period bit PV to "0", sets the write/erase end flag FLAG to "1", and resets the rewrite enable bit SWE to "0", whereby a series of writing processes are finished.

A procedure for the erase operation executed in the flash memory unit employed in the embodiment will next be explained with reference to FIG. 21.

When the CPU sets an erase command and an erase address to the flash memory unit and resets the write/erase end flag FLAG to "0" (Steps S111 through S113), the sequencer 20' is started to perform erase operation control according to a procedure of Steps S114 through S130.

The sequencer 20' first sets the rewrite enable bit SWE of the control register CRG to "1" and resets the post erase period bit POSTE to "0" (Steps S114 and S115). Next, the sequencer 20' sets the erase verify period bit EV of the control register CRG to "1" (Step S116). Thus, data corresponding to the address specified by the CPU in Step S112 is read from the corresponding memory array within the flash memory unit.

The sequencer 20' determines the read data (Step S117). When the erasing is found to be uncompleted from the data determination, the sequencer 20' resets the erase verify period bit EV to "0" and sets the erase period bit E to "1" in the following Step S118. Thus, the booster circuit 31 starts boosting. Thereafter, the management of an erase voltage apply-time by the apply-time control circuit 21 according to an attainment detection signal outputted from the attained voltage detecting circuit 32, and the detection of erase completion by the erase end detecting circuit 22 are automatically advanced.

In step S119, the sequencer 20' monitors a detected signal outputted from the discharge & voltage attainment detecting circuit 33 and determines whether the discharge is finished. When the discharge is found to have been finished, the sequencer 20' resets the erase period bit E to "0" in the next Step S120 and returns to Step S116, where the above-described operation is repeated. When it is judged from the verify data determination in Step S117 that the data have coincided with each other, the sequencer 20' proceeds to Step S121, where it resets the verify period bit EV to "0" and finishes the erase operation. Thereafter, the sequencer 20' proceeds to Step S122, where it sets the post erase period bit POSTE to "1".

Thus, a post erase operation for slightly increasing the threshold voltage of each memory cell whose threshold voltage is excessively lowered, is started. Upon post erasing, the sequencer 20' first sets the rewrite enable bit SWE of the control register CRG to "1" (Step S122). Next, the sequencer 20' specifies or designates an address for designating an object to be post-erased (Step S123). Then, the sequencer 20' sets the erase verify period bit EV to "1" (Step S124). Thus, data for the block specified in Step S123 is read from the corresponding memory array.

The sequencer 20' determines the read data (Step S125). When it is judged from the data determination that the post erasing is necessary, the sequencer 20' resets the erase verify period bit EV to "0" in the following Step S126 and sets the erase period bit E to "1". In doing so, the sequencer 20' allows the booster circuit 31 to start the boosting of a voltage necessary for the post erasing because the post erase period bit POSTE has been set to "1" in Step S122. Thereafter, the generation of each write pulse from the write pulse generator 34 according to an attainment detection signal outputted from the attained voltage detecting circuit 32, the application of a write pulse to each bit line by the write latch control circuit 12, and the detection of write completion by the write end detecting circuit 35 are automatically advanced.

In Step S127, the sequencer 20' monitors a detected signal outputted from the discharge & voltage attainment detecting circuit 33 and determines whether the discharge has been finished. When the discharge is found to have been finished, the sequencer 20' resets the erase period bit E to "0" in the next Step S128 and returns to Step S124, where the above-described operation is repeated. When it is judged from the verify data determination in Step S125 that the data have coincided with each other, the sequencer 20' proceeds to Step S129, where it resets the verify period bit EV and post erase period bit POSTE to "0". Thereafter, the sequencer 20' sets the write/erase end flag FLAG to "1" and resets the rewrite enable bit SWE to "0" in Step S130, thereby completing the post erase operation.

Figure 22:
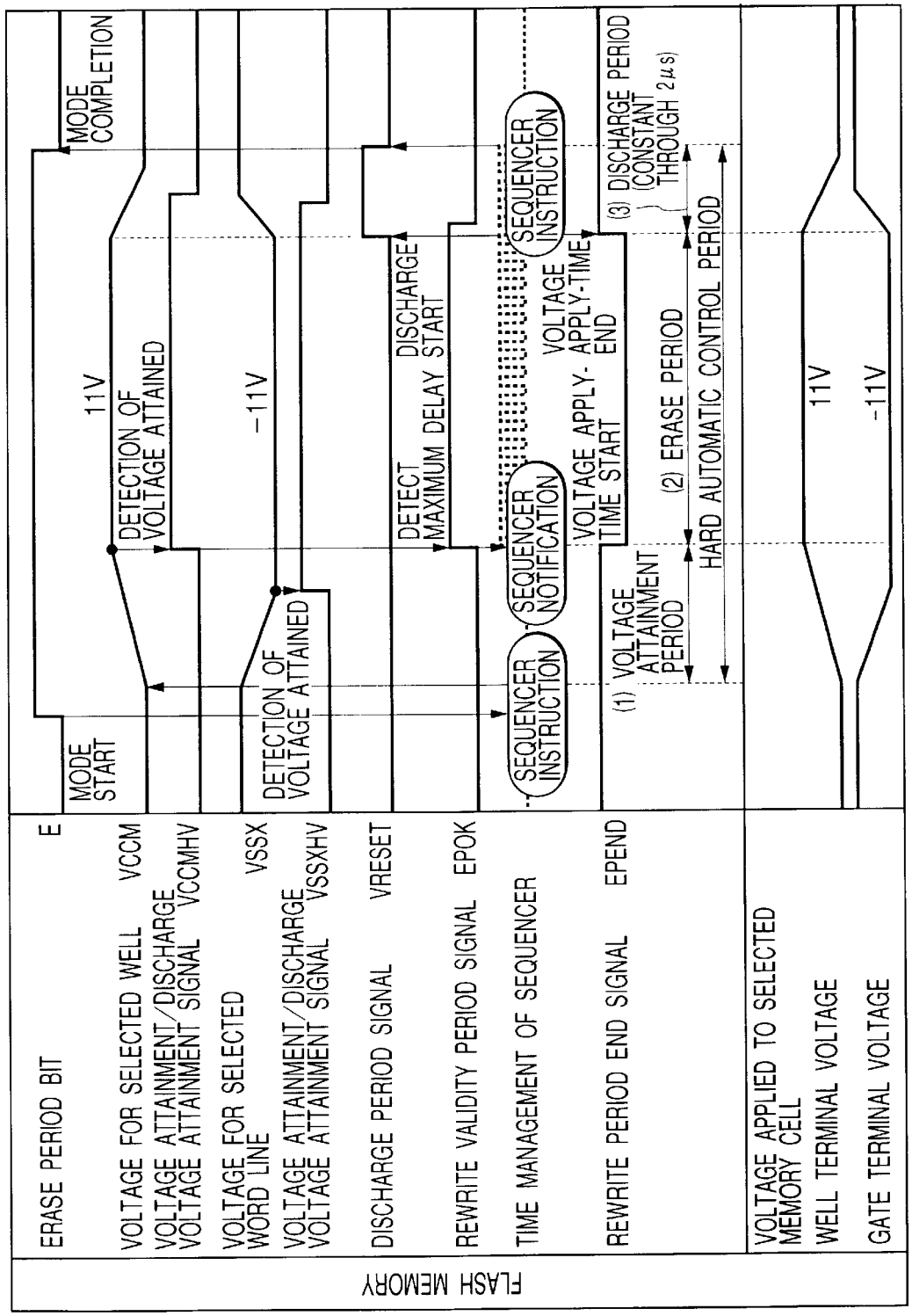
FIG. 22 is a timing chart for describing timings provided for respective signals at an erase operation of a flash memory circuit employed in the embodiment shown in FIG. 19.

FIG. 22 shows timings provided for the internal signals at the erase operation in the flash memory chip under the control of the sequencer 20'. Incidentally, the timings provided for the internal signals according to the erase operation in the flash memory chip according to the present embodiment are substantially identical to those described in the above-described embodiment with reference to FIG. 12. The timings are different from those described with reference to FIG. 12 in that when an erase period bit E of a command register is set, boosting is started by an internal sequencer, and when the boosted voltage has reached a target voltage, it is notified to a sequencer, which in turn stops a boosting operation to start writing, whereas when the writing is completed, the sequencer starts the discharge of a booster circuit and stops discharging after the elapse of a predetermined time.

Figure 10:
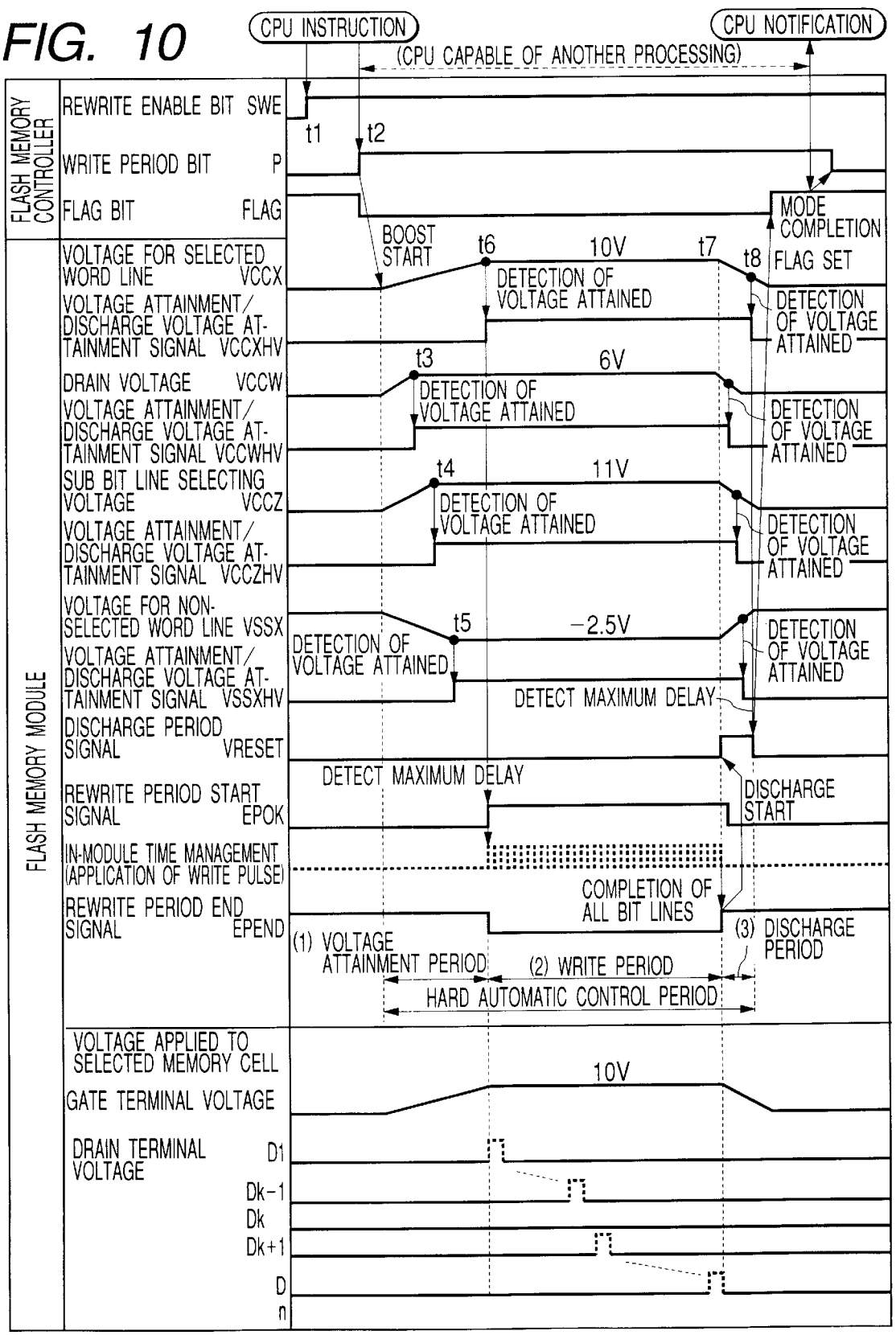
FIG. 10 is a timing chart for describing respective signals at a write operation of the flash memory unit employed in the embodiment.
Figure 11:
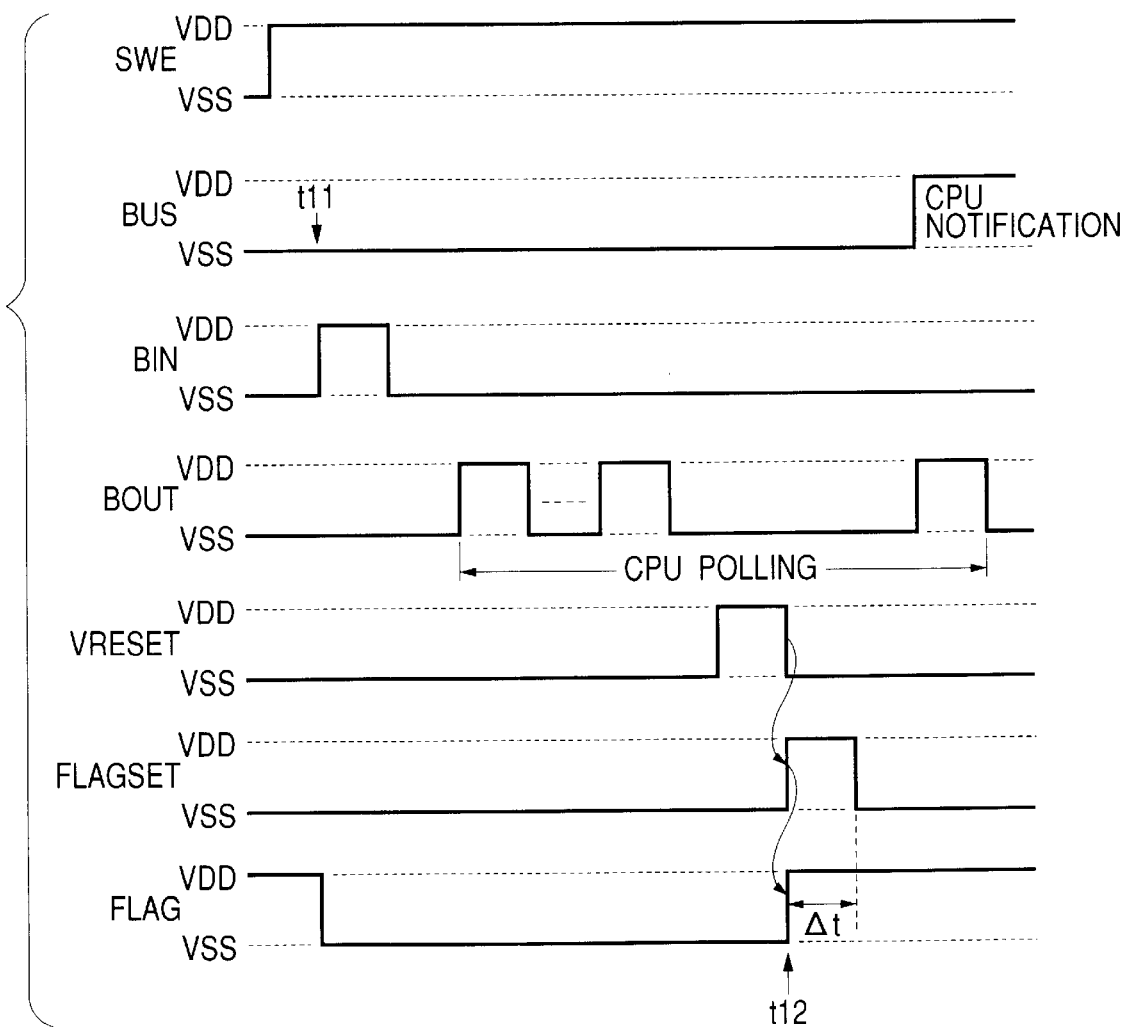
FIG. 11 is a timing chart for describing respective signals relative to the end flag of the flash mode controller employed in the embodiment.

Incidentally, although not illustrated in the drawing, timings provided for internal signals according to the write operation in the flash memory chip, which are executed under the control of the sequencer 20', are also substantially identical to the timings described in the above-described embodiment with reference to FIG. 10. The timings are different from those described in the above-described embodiment in that the timings provided for the respective signals are controlled by the sequencer.

Figure 23:
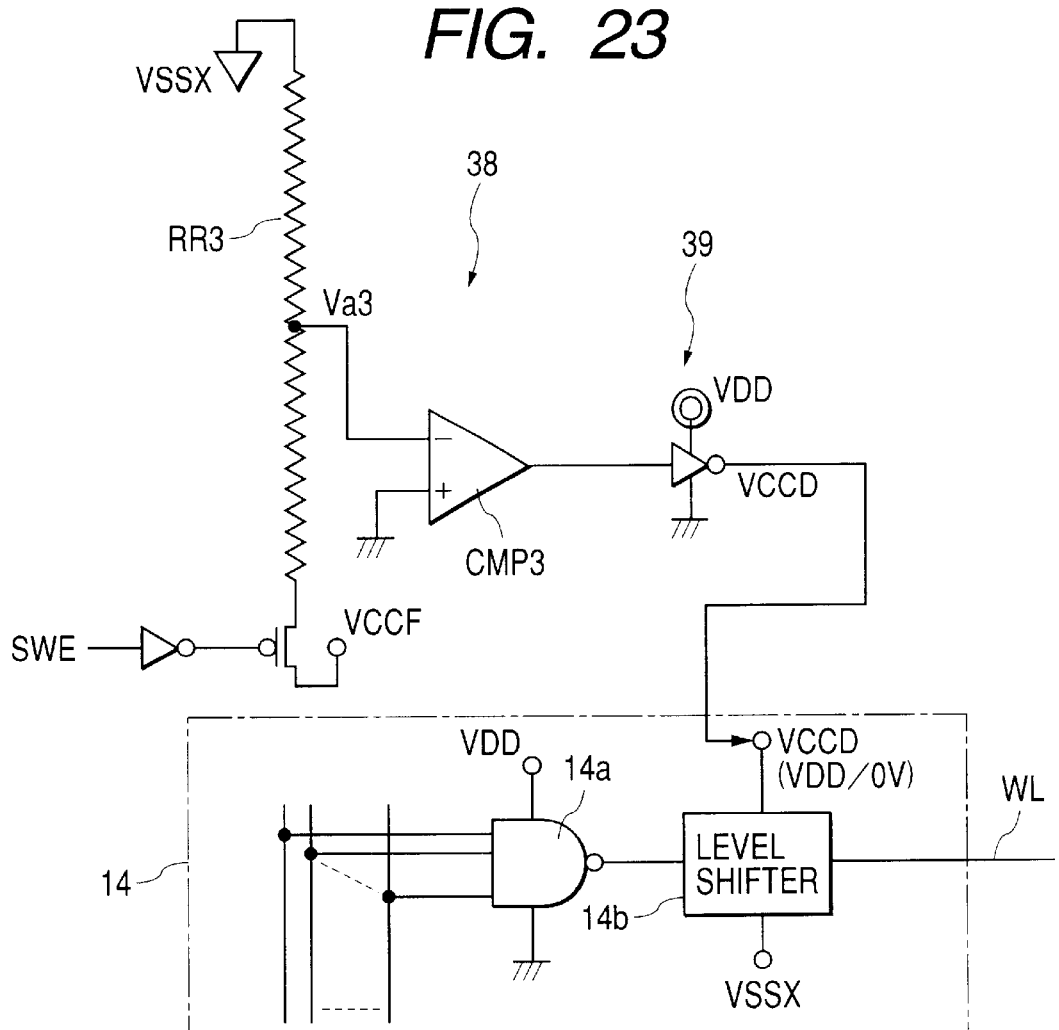
FIG. 23 is a circuit diagram showing an embodiment of a power switching circuit of a decoder unit of a flash memory to which the present invention is applied.

FIG. 23 shows specific examples of the X-decoder 14 and its power switching circuit employed in the embodiment shown in FIG. 5. As shown in FIG. 23, the X-decoder 14 comprises a NAND gate 14a which receives internal address signals Ax0, Ax1, . . . Axn, (/Ax0, /Ax1, . . . /Axn) sent from the address buffer 17, and a level shifter 14b for level-shifting the output of the NAND gate 14a. A combination of the NAND gate 14a and the level shifter 14b is provided for each word line WL.

Since it is necessary to apply the boosted voltage VSSX like −11V to each word line WL upon erasing as described above, the level shifter 14b is configured so as to output −11V to each selected word line according to VDD or 0V of the NAND gate 14a with VSSX as one source voltage. When, at this time, the other source voltage VCCD of the level shifter 14b is of a source voltage (3.3V) for the chip, a high voltage of 14.3V is applied to its corresponding MOSFET constituting the level shifter 14b. Therefore, there is a possibility that such a voltage will exceed the withstand voltage of the MOSFET constituting the level shifter 14b. Incidentally, since a voltage of −2V is applied to each non-selected word line within the same block upon writing, the level shifter 14b is switched to −11V or −2V or the like.

Figure 24:
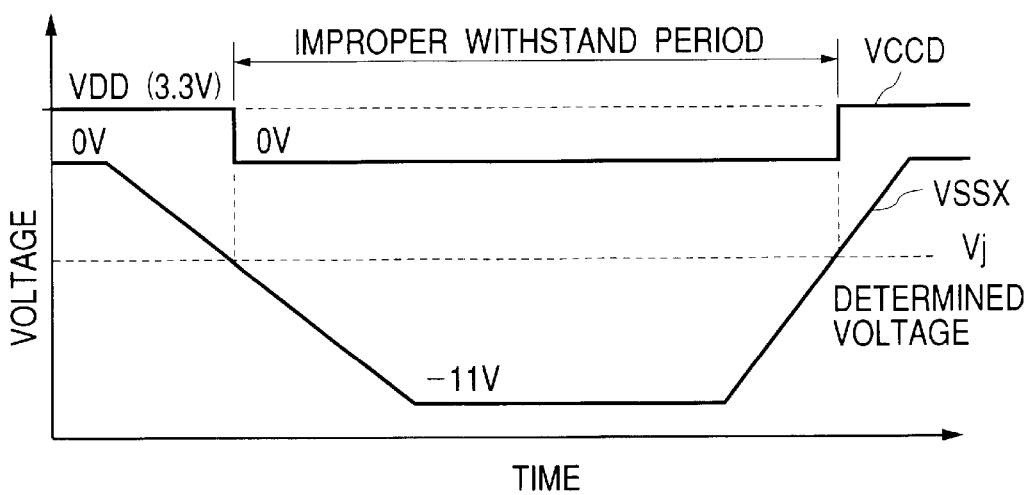
FIG. 24 is a timing chart for describing timings provided to switch between a boosted voltage and a source voltage applied to the circuit employed in the embodiment shown in FIG. 23.

Thus, in the flash memory unit employed in the embodiment, the booster circuit 31 for generating the boosted voltage VSSX like −11V applied to each word line WL upon an erasing mode is provided with a level determining circuit 38 for detecting whether the generated boosted voltage VSSX has exceeded a predetermined level, and a power switching circuit 39 for selecting a power supply or source according to a signal outputted from the level determining circuit 38. As shown in FIG. 24, when the boosted voltage VSSX has exceeded a predetermined level Vj, the other source voltage VCCD supplied to the level shifter 14b is switched from the voltage VDD like 3.3V to a ground potential (0V).

As shown in FIG. 23, the level determining circuit 38 comprises a ladder resistor RR3 connected between the boosted voltage VSSX and a source voltage VCCF (1.4V), and a comparator CMP3 for comparing a voltage Va3 divided by the ladder resistor RR3 and a reference voltage (0V) to thereby determine whether the boosted voltage VSSX has exceeded the predetermined level Vj. Further, the power switching circuit 39 comprises an inverter operated with VDD and the ground potential (0V) as source voltages. Before the boosted voltage VSSX exceeds the predetermined level Vj, the output of the level determining circuit 38 is rendered high in level, and an output voltage equivalent to VDD (3.3V) is supplied from the next-stage inverter as the source voltage VCCD of the level shifter 14b.

On the other hand, when the boosted voltage VSSX exceeds the predetermined level Vj, the output of the level determining circuit 38 is brought to a low level, so that the ground potential (0V) is supplied from the next-stage inverter as the source voltage VCCD of the level shifter 14b. Thus, the voltage applied to the corresponding MOSFET constituting the level shifter 14b is set to 14.3V when the selection of the source voltage is not made, whereas the voltage is reduced to 11V by the execution of its selection.

Thus, the voltage applied to each MOSFET can be reduced while the voltage applied to each word line remains identical.

FIG. 25 shows one example of the charge pump circuit for generating the boosted voltage VSSX like −11V. In the drawing, MOSFETs series-connected between a source voltage terminal VSS and an output terminal VSSX are MOSFETs which function as diodes respectively, even-numbered capacitors respectively connected to nodes at which these diode MOSFETs are coupled, are capacitors for the transfer of electrical charges, and odd-numbered capacitors respectively connected to the gates of the diode MOSFETs are gate voltage-boosting capacitors. Further, DRV1 through DRV4 indicate clock signals respectively. Of these clock signals, DRV1 and DRV2 are clocks opposite in phase to each other, DRV3 and DPV4 are clocks substantially opposite in phase to each other, and DRV1 and DRV3 are clocks substantially in phase and slightly different in duty from each other. While the charge pump circuit is operated according to four clocks in the embodiment, the two-phase clocks may operate it.

Figure 26:
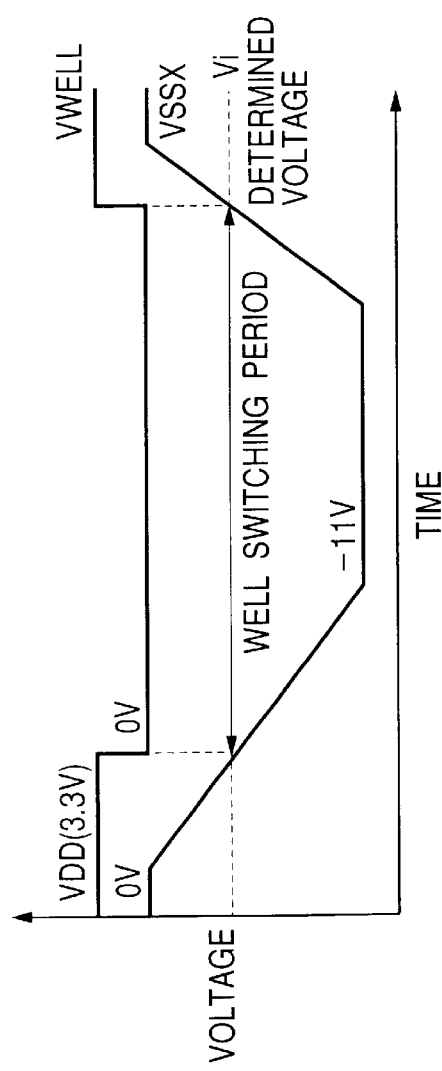
FIG. 26 is a timing chart for describing timings provided to switch between a boosted voltage and well potentials in the circuit employed in the embodiment shown in FIG. 25.

In the charge pump circuit employed in the embodiment, the MOSFETs constituting the circuit are divided into two groups corresponding to the low voltage side and high voltage side, which are respectively formed on discrete well regions WELL1 and WELL2. In this case, the well region in which P channel types are used in the MOSFETs constituting the charge pump circuit, is an N type. Thus, a bias voltage applied to one well region WELL1 is fixed to VDD (3.3V), whereas a bias voltage VWEL applied to the well region WELL2 in which the MOSFETs close to the other output side is formed, is switched to VDD (3.3V) when VSSX is low, according to a boosted voltage VSSX as shown in FIG. 26, and switched to a ground potential (0V) when VSSX becomes high, according to the boosted voltage VSSX.

Each of the MOSFETs has the characteristic that a threshold voltage thereof changes according to the high and low levels of each well potential due to a phenomenon called a substrate effect as a device characteristic. In the charge pump circuit having such a configuration as shown in FIG. 25, if the well potentials are identical, then the threshold voltage of each MOSFET becomes high as a source-to-drain voltage becomes high. As a result, a problem arises in that the efficiency of transfer of an electrical charge is reduced and the boosted voltage is lowered.

However, there is an advantage in that the selection of the bias voltage VWEL applied to the well region WELL2 according to the boosted voltage VSSX makes it possible to control or suppress an increase in the threshold voltage of each MOSFET with an increase in boosted voltage VSSX, whereby a reduction in boosted voltage can be avoided. Since the normal well potential is applied while the boosted voltage VSSX is low, a forward voltage is applied to a PN junction between a source-to-drain region and each well region to thereby allow the prevention of a leak current from flowing.

Incidentally, the mechanism of selecting the bias voltage VWEL applied to the well region WELL2 can make use of the same system as the selection of the source voltage of the level shifter 14b shown in FIG. 23. Namely, the provision of circuits equivalent to the level determining circuit 38 for detecting whether the generated boosted voltage VSSX has exceeded the predetermined level Vj and the power switching circuit 39 for performing switching between the power supplies or sources according to the signal outputted from the level determining circuit 38 in the booster circuit 31 for generating the boosted voltage VSSX like −11V applied to each word line WL upon the erasing mode makes it possible to select the bias voltage VWEL applied to the well region WELL2.

While the booster circuit for generating the boosted voltage VSSX like −11V applied to the word line WL upon the erasing mode has been described above as an illustrative example, the switching between the well potentials can be applied even to a booster circuit for generating a positive boosted voltage VCCX like 10V applied to each word line upon a write mode and a booster circuit for generating a boosted voltage VCCZ like 11V applied to a gate terminal of each selection switch Z-SW. Since, in that case, an N channel type is used for each of MOSFETs constituting a charge pump circuit, and well regions are of a P type respectively, the potential applied to the well region in which the MOSFETs on the output side may be switched to potentials ranging from a ground voltage 0V to a source voltage VDD (3.3V) if the boosted voltage has reached a certain level or more. Thus, an effect similar to the embodiments described in FIGS. 25 and 26 can be obtained. While the well regions in which the MOSFETs constituting the charge pump circuit are formed, are divided into the two, they may be divided into three or more.

While the invention made above by the present inventors has been described specifically by the illustrated embodiments, the present invention is not limited to the embodiments. It is needless to say that various changes can be made thereto within the scope not departing from the substance thereof. While, for example, the embodiment has been described in such a manner that the rewrite enable bit SWE is provided in the control register CRG of the flash mode controller FLC and the CPU sets the bit before the start of the writing and erasing, the bit is not necessarily required and may be omitted.

While the embodiment has described the case in which the invention is applied to the so-called DiNOR type flash memory wherein the drains of the plural memory cells are connected to their corresponding sub bit lines and the sub bit lines are connected to their corresponding main bit lines through the selection switches, the invention can be applied even to a so-called NOR type flash memory wherein a plurality of memory cells are connected in series, a so-called AND type flash memory wherein sources and drains of plural memory cells are respectively connected to local source and drain lines, etc. Even in this case, an effect similar to the above can be obtained.

While the above description has principally been made of the case in which the invention made by the present inventors is applied to the flash memory unit and the microcomputer having it built therein, which belong to the field of application corresponding to the background of the invention, the present invention is not limited to it. The invention can be used in a nonvolatile storage memory such as an EEPROM or the like, a microcomputer having the nonvolatile storage memory built therein, and other semiconductor integrated circuits.

Advantageous effects obtained by typical ones of the inventions disclosed in the present application will be described in brief as follows:

According to the present invention, a nonvolatile memory capable of shortening a total write time required, and a microcomputer with the nonvolatile memory built therein can be implemented.

It is also possible to implement a nonvolatile memory capable of performing writing and erasing in a optimum time without taking measures such as the re-design of a booster circuit, rewriting or updating of a CPU's program, etc. even in the case where internal booster circuits are different in boosting time due to the difference between specifications of storage capacities or the like, and a microcomputer with the nonvolatile memory built therein.

What is claimed is:

1. A nonvolatile memory comprising:
   a memory array having a plurality of nonvolatile memory elements which store data according to magnitudes of threshold voltages thereof;
   a booster circuit which generates a voltage applied to each of the nonvolatile memory elements upon writing or erasing of the data;
   a boosted voltage detecting circuit which detects the level of the voltage boosted by the booster circuit;
   a write/erase control circuit which starts the writing or erasing based on the detection of the voltage by the boosted voltage detecting circuit;
   a write/erase end detecting circuit which detects the completion of the writing or erasing started by the write/erase control circuit; and
   an end flag indicative of the completion of the writing or erasing started by the write/erase control circuit;
   further including a control register having control bits each indicative of an entry into an operation for the writing or erasing,
   wherein the booster circuit starts boosting according to the control bit set thereto.

2. The nonvolatile memory according to claim 1, further including,
   a plurality of booster circuits which generate a plurality of voltages respectively applied to the nonvolatile memory elements upon writing or erasing of data; and
   a plurality of boosted voltage detecting circuits which respectively detect the levels of the voltages boosted by the plurality of booster circuits,
   wherein the write/erase control circuit starts writing or erasing based on the result that the plurality of boosted voltage detecting circuits have detected that all the boosted voltages respectively have attained a predetermined level.

3. The nonvolatile memory according to claim 2, wherein the write/erase end detecting circuit comprises a delay circuit which delays a signal detected by said each boosted voltage detecting circuit, or a counter circuit which counts a clock signal, based on the detected signal.

4. The nonvolatile memory according to claim 3, further including a discharge circuit which discharges the voltage boosted by the booster circuit,
   wherein the discharge circuit starts discharging based on a signal detected by the write/erase end detecting circuit.

5. The nonvolatile memory according to claim 4, further including a discharge end detecting circuit which detects that the output voltage of the booster circuit, which has been discharged by the discharge circuit, has reached a predetermined level,
   wherein the end flag is set based on a signal detected by the discharge end detecting circuit.

6. The nonvolatile memory according to claim 5, further including a data register which holds write data therein, and a write control circuit which applies a write voltage to each of bit lines according to the write data held in the data register,
   wherein when bits for the write data held in the data register are of a logic "1" (or logic "0"), the write control circuit skips the bits and sequentially applies the write voltage in association with each of bits indicative of the logic "0" (or logic "1").

7. The nonvolatile memory according to claim 6, wherein the time required to apply the write voltage is determined based on a clock signal and changed according to a change in the cycle of the clock signal.

8. The nonvolatile memory according to claim 7, further including a shift register which sequentially outputs the write voltage, based on the clock signal and the write data held in the data register,
   wherein the write/erase end detecting circuit detects that a pulse has reached a final stage of the shift register, thereby judging the writing to be completed.

9. The nonvolatile memory according to claim 8, further including a level shifter which supplies the boosted voltage generated by the booster circuit to each of the nonvolatile memory elements upon writing or erasing, and a level determining circuit which determines the level of the boosted voltage generated by the booster circuit,
   wherein when the level determining circuit has determined that the boosted voltage has exceeded a predetermined level, the level determining circuit serves so as to select a source voltage applied to the level shifter.

10. The nonvolatile memory according to claim 9, further including a second level determining circuit which determines the level of the boosted voltage generated by the booster circuit,
    wherein the booster circuit comprises a charge pump comprised of MOSFETs, which are formed in a plurality of well regions formed on the surface of a semiconductor substrate in the form of being divided into the high-voltage side and the low-voltage side, and the booster circuit is configured so as to select a bias voltage applied to the well region on the high-voltage side when the second level determining circuit determines that the boosted voltage has reached a predetermined level.

11. The nonvolatile memory according to claim 10, further including a command register which holds a command code supplied from outside, and a sequence control circuit which performs write or erase control according to the command code set to the command register,
    wherein the sequence control circuit sets the respective control bits of the control register in response to a predetermined signal outputted from an internal circuit and starts the operations of other internal circuits to which the control bits are set.

12. A semiconductor device incorporating therein:
    a nonvolatile memory having a plurality of nonvolatile memory elements which store data according to the magnitudes of threshold voltages thereof;
    a booster circuit which generates a voltage applied to each of the nonvolatile memory elements upon writing or erasing of the data;
    a boosted voltage detecting circuit which detects the level of the voltage boosted by the booster circuit;
    a write/erase control circuit which starts the writing or erasing based on the detection of the voltage by the boosted voltage detecting circuit;
    a write/erase end detecting circuit which detects the completion of the writing or erasing started by the write/erase control circuit;
    an end flag indicative of the completion of the writing or erasing started by the write/erase control circuit;

a control register having control bits each indicative of an entry into an operation for the writing or erasing; and a control circuit for giving instructions as to any of the writing, erasing and reading to the nonvolatile memory according to the setting of the control bits of the control register.

13. The semiconductor device according to claim 12, wherein the control circuit reads the end flag to thereby detect that the operation for the nonvolatile memory has been completed, and sets the corresponding control bit of the control register to thereby provide the following instructions.

14. The semiconductor device according to claim 13, further including a plurality of booster circuits which generate a plurality of voltages applied to the nonvolatile memory elements upon writing and erasing of data; and a plurality of boosted voltage detecting circuits which respectively detect the levels of the voltages boosted by the plurality of booster circuits, wherein the write/erase control circuit starts writing or erasing based on the result that the plurality of boosted voltage detecting circuits have detected that all the boosted voltages respectively have attained a predetermined level.

15. The semiconductor device according to claim 14, wherein the write/erase end detecting circuit comprises a delay circuit which delays a signal detected by said each boosted voltage detecting circuit, or a counter circuit which counts a clock signal, based on the detected signal.

16. The semiconductor device according to claim 15, further including a discharge circuit which discharges the voltage boosted by the booster circuit, wherein the discharge circuit starts discharging based on a signal detected by the write/erase end detecting circuit.

17. The semiconductor device according to claim 16, further including a discharge end detecting circuit which detects that the output voltage of the booster circuit, which has been discharged by the discharge circuit, has reached a predetermined level, wherein the end flag is set based on a signal detected by the discharge end detecting circuit.

18. The semiconductor device according to claim 17, further including a data register which holds write data therein, and a write control circuit which applies a write voltage to each of bit lines according to the write data held in the data register, wherein when bits for the write data held in the data register are of a logic "1" (or logic "0"), the write control circuit skips the bits and sequentially applies the write voltage in association with each of bits indicative of the logic "0" (or logic "1").

19. The semiconductor device according to claim 18, wherein the time required to apply the write voltage is determined based on a clock signal and changed according to a change in the cycle of the clock signal.

20. The semiconductor device according to claim 18, further including a shift register which sequentially outputs the write voltage, based on the clock signal and the write data held in the data register, wherein the write/erase end detecting circuit detects that a pulse has reached a final stage of the shift register, thereby judging the writing to be completed.

21. The semiconductor device according to claim 20, further including a level shifter which supplies the boosted voltage generated by the booster circuit to each of the nonvolatile memory elements upon writing or erasing, and a level determining circuit which determines the level of the boosted voltage generated by the booster circuit, wherein when the level determining circuit has determined that the boosted voltage has exceeded a predetermined level, the level determining circuit serves so as to select a source voltage applied to the level shifter.

22. The semiconductor device according to claim 21, further including a second level determining circuit which determines the level of the boosted voltage generated by the booster circuit, wherein the booster circuit comprises a charge pump having MOSFETs constituting the charge pump, which are formed in a plurality of well regions formed on the surface of a semiconductor substrate in the form of being divided into the high-voltage side and the low-voltage side, and the booster circuit is configured so as to select a bias voltage applied to the well region on the high-voltage side when the second level determining circuit determines that the boosted voltage has reached a predetermined level.

* * * * *